US008934292B2

(12) United States Patent
Costa et al.

(10) Patent No.: US 8,934,292 B2
(45) Date of Patent: Jan. 13, 2015

(54) BALANCED METHOD FOR PROGRAMMING MULTI-LAYER CELL MEMORIES

(75) Inventors: Xiying Costa, San Jose, CA (US); Yibo Nian, Sunnyvale, CA (US); Roy Scheuerlein, Cupertino, CA (US); Tz-Yi Liu, Palo Alto, CA (US); Chandrasekhar Reddy Gorla, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 845 days.

(21) Appl. No.: 13/051,885

(22) Filed: Mar. 18, 2011

(65) Prior Publication Data

US 2012/0236624 A1 Sep. 20, 2012

(51) Int. Cl.
*G11C 11/00* (2006.01)
*G11C 13/00* (2006.01)
*G11C 11/56* (2006.01)

(52) U.S. Cl.
CPC ............ *G11C 13/0069* (2013.01); *G11C 11/56* (2013.01); *G11C 11/5664* (2013.01); *G11C 11/5678* (2013.01); *G11C 11/5685* (2013.01); *G11C 13/0007* (2013.01); *G11C 13/0064* (2013.01); *G11C 2013/0071* (2013.01); *G11C 2013/0073* (2013.01); *G11C 2013/0076* (2013.01); *G11C 2013/0092* (2013.01); *G11C 2213/32* (2013.01)
USPC .......................................... 365/163; 365/148

(58) Field of Classification Search
USPC ............................ 365/46, 100, 148, 158, 163
See application file for complete search history.

(56) References Cited

U.S. PATENT DOCUMENTS

| 4,646,266 A | 2/1987 | Ovshinsky et al. |
| 5,014,241 A | 5/1991 | Asakura et al. |

(Continued)

FOREIGN PATENT DOCUMENTS

| WO | 2009051274 A1 | 4/2009 |
| WO | 2009142828 A1 | 11/2009 |

OTHER PUBLICATIONS

International Search Report & Written Opinion, WIPO, PCT/US2010/031876, Jul. 22, 2010.

(Continued)

*Primary Examiner* — Vanthu Nguyen
*Assistant Examiner* — Khamdan Alrobaie
(74) *Attorney, Agent, or Firm* — The Marbury Law Group PLLC

(57) ABSTRACT

Improved methods for programming multi-level metal oxide memory cells balance applied voltage and current to provide improved performance. Set programming, which transitions the memory cell to a lower resistance state, is accomplished by determining an appropriate programming voltage and current limit for the objective resistance state to be achieved in the programming and then applying a pulse having the determined set electrical characteristics. Reset programming, which transitions the memory cell to a higher resistance state, is accomplished by determining an appropriate programming voltage and optionally current limit for the state to be achieved in the programming and then applying a pulse having the determined electrical characteristics. The algorithm used to determine the appropriate set or reset programming voltage and current values provides for effective programming without stressing the memory element. The electrical characteristics for programming pulses may be stored in a data table used in a table look up algorithm.

42 Claims, 11 Drawing Sheets

(56) References Cited

U.S. PATENT DOCUMENTS

| | | | |
|---|---|---|---|
| 5,751,012 A | 5/1998 | Wolstenholme et al. | |
| 5,835,396 A | 11/1998 | Zhang | |
| 5,841,687 A | 11/1998 | Rees | |
| 6,034,882 A | 3/2000 | Johnson et al. | |
| 6,055,180 A | 4/2000 | Gudesen et al. | |
| 6,185,122 B1 | 2/2001 | Johnson et al. | |
| 6,420,215 B1 | 7/2002 | Knall et al. | |
| 6,618,295 B2 | 9/2003 | Scheuerlein | |
| 6,631,085 B2 | 10/2003 | Kleveland et al. | |
| 7,081,377 B2 | 7/2006 | Cleeves | |
| 2002/0163033 A1 | 11/2002 | Sugawara et al. | |
| 2005/0269553 A1 | 12/2005 | Sen et al. | |
| 2006/0166455 A1 | 7/2006 | Gordon et al. | |
| 2007/0114509 A1 | 5/2007 | Herner | |
| 2007/0242549 A1* | 10/2007 | Klostermann et al. | 365/226 |
| 2008/0025085 A1 | 1/2008 | Scheuerlein et al. | |
| 2008/0123389 A1 | 5/2008 | Cho et al. | |
| 2009/0040816 A1* | 2/2009 | Kang et al. | 365/163 |
| 2009/0161421 A1* | 6/2009 | Cho et al. | 365/163 |
| 2009/0231910 A1* | 9/2009 | Liu et al. | 365/163 |
| 2009/0323394 A1* | 12/2009 | Scheuerlein | 365/148 |
| 2010/0173457 A1 | 7/2010 | Herner et al. | |
| 2010/0271885 A1 | 10/2010 | Scheuerlein et al. | |
| 2011/0038195 A1 | 2/2011 | Hamilton et al. | |
| 2011/0205782 A1* | 8/2011 | Costa et al. | 365/148 |

OTHER PUBLICATIONS

Peter K. Naji et al., "A 256 kb 3.0V 1T1MTJ Nonvolatile Magnetoresistive RAM," Digest of Technical Papers of the 2001 IEEE International Solid State Circuits Conference, ISSCC 2001 Session 7 Technology Directions: Advanced Technologies 7.6, Feb. 6, 2001, pp. 94-95, 404-405 of ISSCC Visual Supplement.

U.S. Appl. No. 12/938,028, "Single Device Driver Circuit to Control Three-Dimensional Memory Element Array," Roy E. Scheuerlein et al., filed Nov. 2, 2010.

International Search Report & Written Opinion, issued in PCT Application No. PCT/US2012/029416, mailed on May 21, 2012.

* cited by examiner

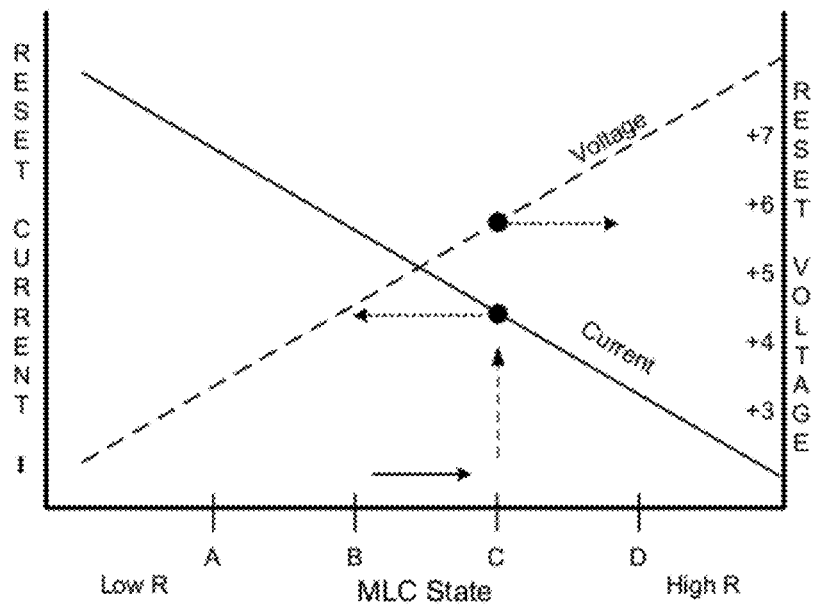

BALANCED METHOD FOR PROGRAMMING MULTI-LAYER CELL MEMORIES

FIELD

The present invention relates to semiconductor integrated circuits containing memory arrays, particularly to methods of programming multi-level memory cells.

BACKGROUND

The development of the storage class memory (SCM) devices have blurred the boundaries between storage (slow, cheap, and non-volatile) and memory (fast, expensive, and volatile) in the computer and semiconductor industry. Metal oxide multi-level cell (MLC) memories are one of the most promising candidates to achieve all the SCM features, such as non-volatile, short access times, low cost per bit, and solid state requirements. The SCM cells are often compared on the basis of a measure term $F^2$, or "feature size squared". The smaller the $F^2$ measure, the more SCM cells per unit area. In a three-dimensional (3D) vertical memory array architecture, resistance random access memories (RRAM) made of metal oxide resistor elements may be able to achieve 0.5 $F^2$ with an eight-layer stack. An eight-layer stack may introduce severe integration challenges with the technology node scaled down. However, four levels of multi-level-cell (MLC) operation helps to achieve the same $F^2$ measure with half the number of the memory cell layers. As a well known factor, the metal oxide memory cells have been operated at the breakdown region. Minimum endurance requirements in the solid-state storage device application for MLC memories are much smaller than for single level cell (SLC) memories with the technology node scaled down.

SUMMARY

The various embodiments include improved methods for programming multi-level metal oxide memory cells that balance applied voltage and current to provide improved performance. Embodiment methods may include operations of receiving data to be written to the memory device, selecting a memory cell to which a portion of the received data is to be written, determining a current resistance state of the selected memory cell, determining an objective resistance state for representing data to be written to the selected memory cell, determining whether the writing of data to the selected memory cell will involve increasing or decreasing resistance of the selected memory cell based on the current resistance state and the objective resistance state, determining electrical characteristics for a programming pulse that will transform the resistance state of the selected memory cell to the objective resistance state based on the objective resistance state and whether the writing of data to the selected memory cell will involve increasing or decreasing resistance of the selected memory cell, and applying to the selected memory cell a programming pulse having the determined electrical characteristics. The determined electrical characteristics for a programming pulse may include a voltage and a current limit for the programming pulse. The determined electrical characteristics may further include a duration for a programming pulse based on the objective resistance state and whether the writing of data to the selected memory cell will involve increasing or decreasing resistance of the selected memory cell, in which case applying to the selected memory cell a programming pulse having the determined electrical characteristics may include applying such a programming pulse for the determined duration. Determining the electrical characteristics for programming pulses may be performed in a table look up operation using the objective resistance state and whether the programming will involve increasing (reset) or decreasing (set) the resistance of the memory cell. In an embodiment, the resulting resistance of the memory cell may be checked after a programming pulse, and a second programming pulse may be applied if the resulting resistance is not within a tolerance band of threshold limits about the objective resistance. In a further embodiment, programming of memory cells may be accomplished in steps, with each step involving a programming pulse having electrical characteristics (voltages, current limits and durations) determined for each programming step.

Embodiments further encompass memory devices which include an array of multilevel cell resistance memory cells positioned between a plurality of word lines and a plurality of bit lines, a memory controller circuit, a bit line controller coupled to the memory controller circuit and configured to select a bit line in response a control signal from the memory controller circuit, a word line controller coupled to the memory controller circuit and configured to select a word line in response a control signal from the memory controller circuit, a programming pulse generator circuit coupled to the memory controller circuit and configured to generate a programming pulse having a voltage for writing data to selected memory cells in response a control signal from the memory controller circuit, a current limiting circuit coupled to the memory controller circuit and configured to limit current flowing through a selected memory cell during a programming pulse in response a control signal from the memory controller circuit, and a resistance state determining circuit coupled to the memory controller circuit, the bit line controller and the word line controller and configured to determine a resistance state of a selected memory cell. In such memory devices, the memory controller circuit is configured to control the bit line and word line decoders and pulse generator circuit so the device performs data writing operations including receiving data to be written to the memory device, activating the bit line and word line controllers to select a memory cell to which a portion of the received data is to be written, obtaining a current resistance state of the selected memory cell from the resistance state determining circuit, determining an objective resistance state for representing data to be written to the selected memory cell, determining whether the writing of data to the selected memory cell will involve increasing or decreasing resistance of the selected memory cell based on the current resistance state and the objective resistance state, determining electrical characteristics (i.e., voltage, current limits, and optionally pulse duration) for a programming pulse that will transform the resistance state of the selected memory cell to the objective resistance state based on the objective resistance state and whether the writing of data to the selected memory cell will involve increasing or decreasing resistance of the selected memory cell, and activating the pulse generation circuit and the current limiting circuit to apply to the selected memory cell a programming pulse having the determined electrical characteristics.

In an embodiment, memory devices may include an array of storage means for storing a plurality of a data bits in the form of a plurality of correlated resistance states, means for receiving data to be written to the memory device, means for selecting a storage means to which a portion of the received data is to be written, means for obtaining a current resistance state of the selected storage means, means for determining an objective resistance state for representing data to be written to the selected storage means, means for determining whether the writing of data to the selected storage means will involve increasing or decreasing resistance of the selected storage means based on the current resistance state and the objective resistance state, means for determining electrical characteristics for a programming pulse that will transform the resistance state of the selected storage means to the objective resistance state based on the objective resistance state and whether the writing of data to the selected storage means will involve increasing or decreasing resistance of the selected storage means, and means for applying to the selected storage means a programming pulse having the determined electrical characteristics.

In the embodiment memory devices, the memory cells and storage means may be multilevel cell resistance memory cells including bi-polar metal oxide resistance elements, which may be made from hafnium oxide ($HfO_X$), nickel oxide (NiO), titanium oxide (TiO) or another metal oxide, and may have four, six or more programming levels (i.e., resistance states) for storing more than one bit of data. In such memory devices, the programming pulse electrical characteristics may be stored in a memory as a table to enable determining the electrical characteristics for programming pulses in a table look up operation using the objective resistance state and whether the programming will involve increasing (reset) or decreasing (set) the resistance of the memory cell. The memory controller circuit may further be configured such that if the data to be written in a cell is already represented in the cell (i.e., the current resistance state is within the tolerance limits of the objective resistance state), then no programming pulse is applied. The memory controller circuit may be further configured to determine the resistance of the selected memory cell resulting from a programming pulse and then apply another programming pulse if the resulting resistance is not within tolerance threshold limits of the objective resistance state. The memory controller circuit may be further configured to determine and apply a series programming pulses that ultimately result in the objective resistance state.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIG. 9 is a graph illustrating determining reset programming voltages and current according to an embodiment.

FIGS. 10A and 10B are data tables illustrating a data structure suitable for implementing the various embodiments in memory.

DETAILED DESCRIPTION

Figure 1:
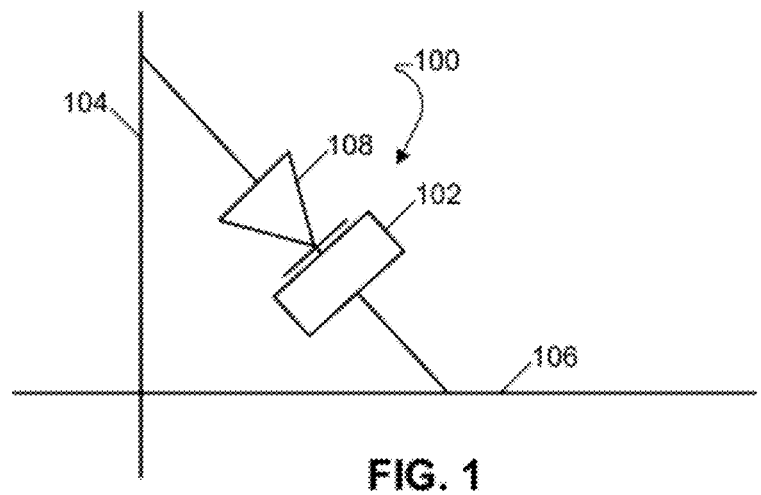
FIG. 1 is a circuit element diagram of a single metal oxide resistance memory cell suitable for use with the various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims. The drawings are not to scale, and well-known structures and devices are shown in simplified form to facilitate description of the various embodiments.

The word "exemplary" is used herein to mean "serving as an example, instance, or illustration." Any implementation described herein as "exemplary" is not necessarily to be construed as preferred or advantageous over other implementations. The terms "word line" and "bit line" are used herein to refer to electrical connections within and among a memory cell array.

In the various embodiments, metal oxide resistance memory cells are programmed by selectively applying voltages and currents to memory cells to cause them to change from one level of resistance to another, with the resulting resistance being measureable to determine the state of (i.e., data stored in) the cell. As used herein, the transition from a higher-resistance state to a lower-resistance state is referred to herein as a set (SET) transition, affected by a set current, a set or programming voltage, or a set or programming pulse in accordance with the various embodiments. As used herein, the reverse transition, from a lower-resistance state to a higher-resistance state is referred to as a reset (RESET) transition, affected by a reset current, a reset voltage, or a reset pulse in accordance with the various embodiments.

The various embodiments provide improved methods for programming multi-level metal oxide resistance random access memory (RRAM) memory cells that balance applied voltage and current to provide improved performance. In the various embodiments, set programming, which transitions the memory cell to a lower resistance state, is accomplished by determining an appropriate programming voltage and current limit for the state to be achieved in the programming and then applying a pulse having the determined set programming voltage and current to the selected memory cell or cells. Similarly, reset programming, which transitions the memory cell to a higher resistance state, is accomplished by determining an appropriate programming voltage and (optionally) current limit for the state to be achieved in the programming and then applying a pulse having the determined reset programming voltage and current to the selected memory cell or cells. The algorithm used to determine the appropriate set or reset programming voltage and current values provides for effective programming without stressing the memory element. In particular, the set programming method applies pulses with increasing current limits but decreasing voltage levels with each subsequent programming level (i.e., decreasing resistance state), while the reset programming method applies pulses with decreasing current but increasing voltage with each subsequent programming level (i.e., increasing resistance state). In embodiments featuring a bipolar metal oxide resistivity element, such as $HfO_2$, the set and reset voltages are of opposite polarity (e.g., the set voltage being negative and the reset voltage being positive), which enables direct write multi-level cells. Direct write multi-level cells means that the memory cells can be programmed to any of their various memory states (i.e., resistance states correlated to particular bit patterns) directly without having to first clear or reset the cells before programming to the desired state. Such metal oxide direct write MLC technology offers low cost, high density storage memory arrays capable of rapid programming.

A number of architectures and configurations of metal oxide RRAM memories have been proposed. The following descriptions with reference to FIGS. 1-4 provide an overview of the structure and configuration of bipolar metal oxide mult-level cell (MLC) memories suitable for use with the various embodiments. Further details and alternative configurations for metal oxide resistance memories are disclosed, for example, in U.S. Pat. Nos. 7,463,536, 7,706,169, and 7,745,312 and U.S. Patent Publication Nos. 2008/0007989 and 2010/0157652, all of which are assigned to the assignee of the present application and are hereby incorporated by reference for the portions disclosing metal oxide RRAM memory cell manufacture, configurations, programming and reading circuits and operation. Some embodiments may also use alternative array organizations with memory cells with no steering element in small sub-arrays as disclosed in U.S. Patent Publication No. 2010/0259960, which is hereby incorporated by reference for the portions disclosing such memory array and cell structures.

Referring to FIG. 1, a resistance memory may be formed as a circuit element including a transformable resistive element 102 (e.g., the storage element of the memory element or the cell itself 100) coupled between a word line 104 and bit line 106. By transforming the resistivity level of the resistance material 102 to a recognizable resistance state, information can be stored in the memory element 100. A recognizable resistance state is a measurable resistance through the element that falls within certain threshold limits (i.e., a range of resistance) that is correlated to certain data bit patterns (e.g., 00, 01, 10, and 11 in a four-level MLC element). Such information can then be determined by sensing the resistance through the resistance material 102 by completing a circuit between the word line 104 and bit line 106 that applies a voltage across the memory cell with the resulting current or voltage drop measured by a read sensing circuit as described more fully below. Typically, a resistance memory element 100 includes a steering element, such as a diode 108, which serves to minimize the leakage current that would otherwise flow through the element when the element is not being addressed. Other steering elements, such as transistors, or even memory cells without steering elements in small sub-arrays may be used.

The resistance element 102 may be manufactured from a variety of variable resistance materials, including an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material. In a preferred embodiment, the resistive element 102 is made from a metal oxide which exhibits bipolar (i.e., reversible resistance) characteristics, including for example, hafnium oxide ($HfO_X$), nickel oxide (NiO), and titanium oxide (e.g., $TiO_2$). Other referred resistivity-switching binary metal oxide or nitride compounds include $Ni_xO_y$, $Nb_xO_y$, $Ti_xO_y$, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, $Al_xN_y$. Examples are the stoichiometric compounds NiO, $Nb_2O_5$, TiO2, $HfO_2$, $Al_2O_3$, $MgO_x$, CoO, $CrO_2$, VO, ZnO, ZrO, BN, and AlN, but nonstoichiometric compounds may be preferred.

Bipolar variable resistance metal oxides (e.g., $HfO_X$) exhibit the convenient characteristic that the resistance level can be decreased (set) by applying electrical pulses with a first polarity (e.g., negative voltage), and increased (reset) by applying electrical pulses with the opposite polarity (e.g. positive voltage). This bipolar characteristic simplifies the programming of the memory element because a programming pulse can be applied to step up in resistance or step down in resistance to achieve a desired programming state without having to completely reset the device and sequence through a series of resistance states to achieve the objective resistance state.

Figure 2:
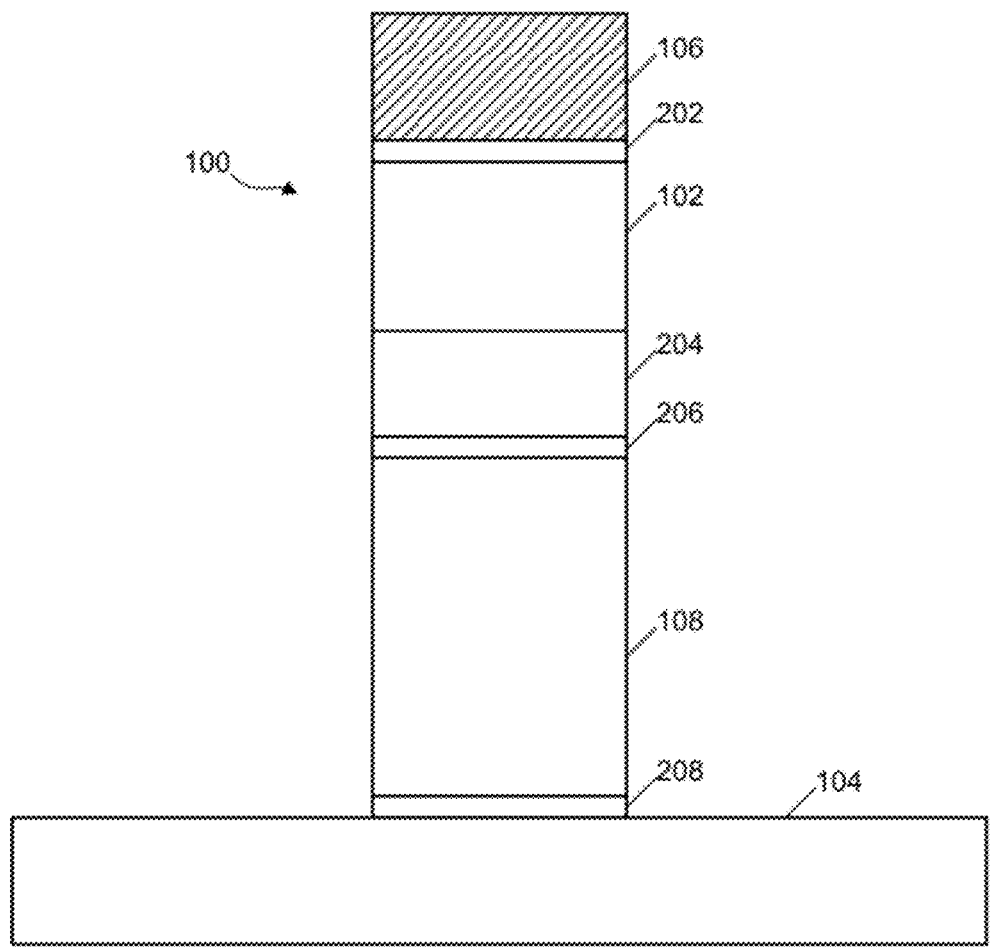
FIG. 2 is a cross-sectional diagram of a single metal oxide memory cell as may be implemented within an integrated circuit.

Such resistivity switching memory cells are typically formed in memory arrays using semiconductor fabrication techniques that form a pillar configuration such as illustrated in FIG. 2. For example, a typical metal oxide resistivity memory element 100 may be formed between a word line 104 and a bit line 106 in a series of layers 102 through 208. For example, this material may include an electrically conductive connection layer, such as made from titanium nitride (TiN) layer 208 which serves to conduct electrical potential to a diode 108, such as a Si, Ge or SiGe P-I-N or P-N diode. A second electrically conductive layer 206 (e.g., TiN) may couple the diode 108 to a buffer layer 204, such as titanium oxide ($TiO_2$). A metal oxide resistance (i.e., resistivity switching) element 102 may be coupled to the buffer layer 204 and to an electrical conduction layer 202 (e.g., TiN) which electrically connects to the bit line 106. In the various embodiments, voltage and current applied to the memory element 100 between the word line 104 and bit line 106 causes the metal oxide resistance element 102 to transition from one resistance state to another in a manner that enables storage of information.

Figure 3:
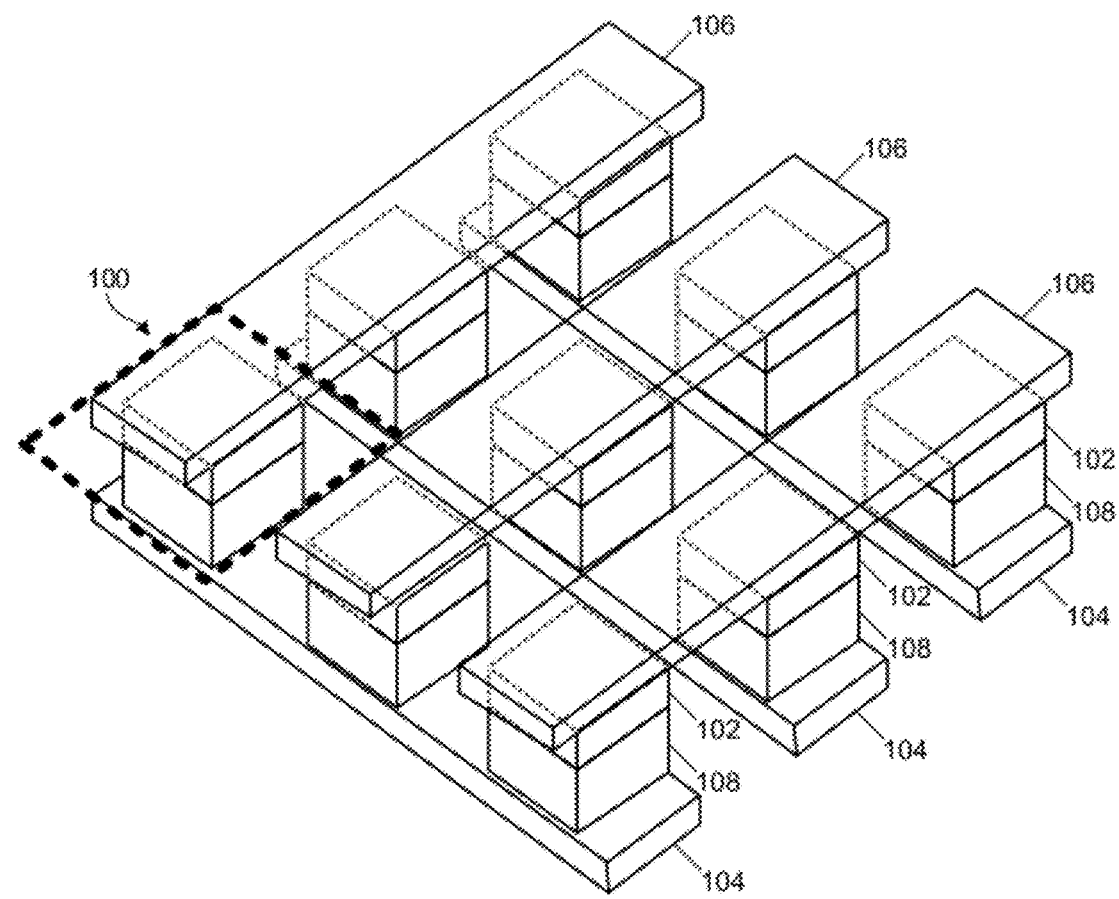
FIG. 3 is a perspective cut-away view of a portion of a metal oxide multi-level cell memory array suitable for use with the various embodiments.

FIG. 3 illustrates how memory cell elements 100 may be densely packed in an array between a series of parallel word lines 104 in a first layer, and an orthogonal parallel array of bit lines 106 in a second level. FIG. 3 illustrates how the feature size in such an array is the size of each memory cell element 100.

Figure 4A:
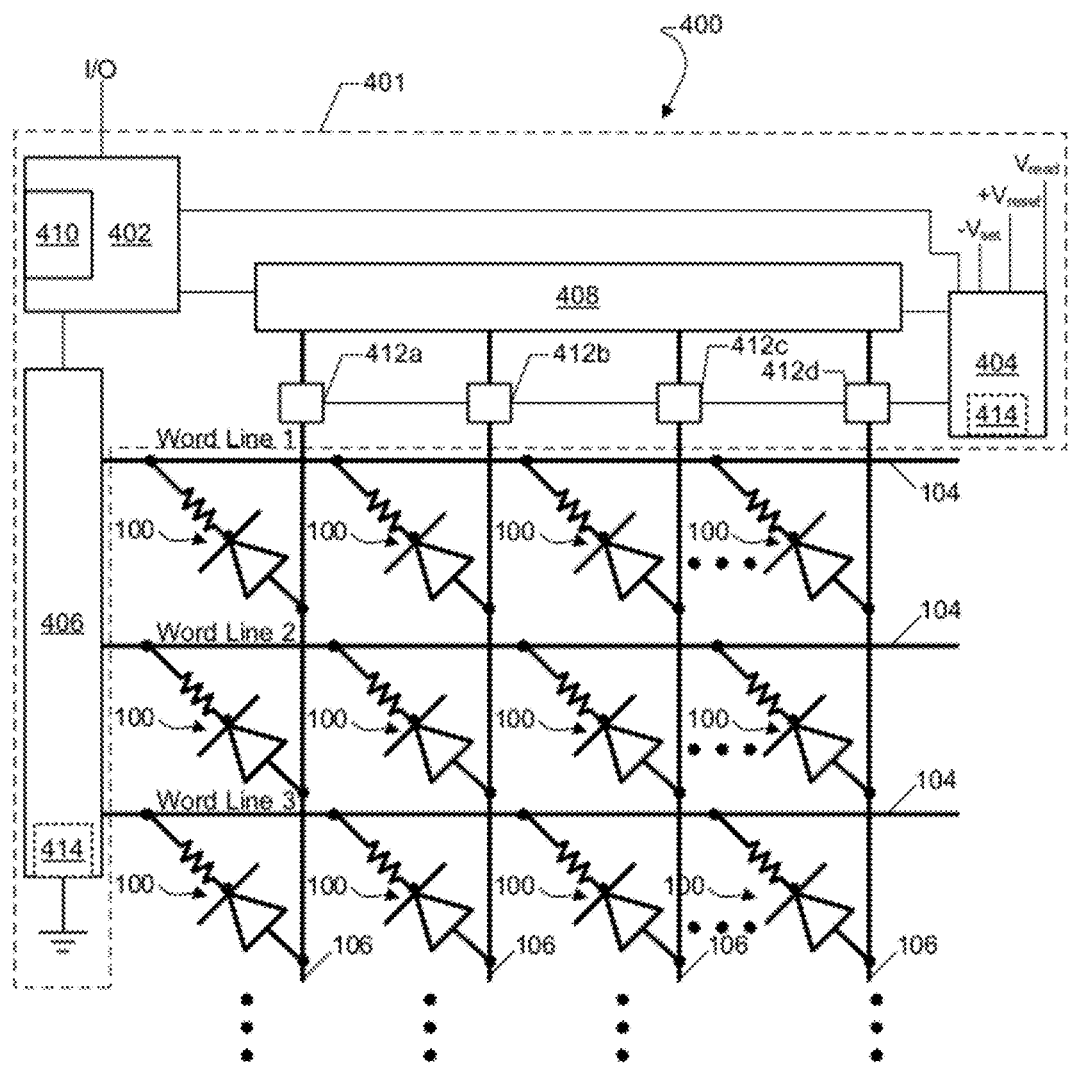
FIGS. 4A and 4B are circuit block diagrams of portions of a metal oxide memory array illustrating some circuit components that may be used to implement the various embodiments.

Arrays of memory cells such as illustrated in FIG. 3 may be connected to driver and decoder circuits in order to create a memory chip 400. The memory chip 400 may include a memory cell programming system 401 configured to set or reset the resistance of memory cell elements 100 as necessary to write data to the cells. A block diagram of example driver and decoder circuit elements in such a memory cell programming system 401 are illustrated in FIG. 4A. As illustrated in this figure, arrays of memory cells 100 coupled between a plurality of word lines 104 and bit lines 106 are typically electrically coupled to a respective word line decoder 406 and a bit line decoder 408 which may be controlled by a memory controller circuit 402. These decoder circuits typically include a plurality of switches which enable individual word and bit lines to be selected for sensing by a resistance or current measuring circuit. Thus, to read a memory cell 100, the word line and bit line decoders 406, 408 are actuated in response to signals from the memory controller circuit 402 to select the word and bit lines coupled to that particular cell and to connect that circuit to a voltage, resistance or current measuring circuit 613 (shown in FIG. 4B).

In order to write data to the metal oxide resistance memory cells 100, electrical pulses are applied to each cell in accordance with the embodiments. To enable the generation and application of such pulses to the individual memory cells 100, the memory cell programming system 401 may include a voltage control circuit 404 that is configured to output voltage pulses of the appropriate width (i.e., duration) and voltage amplitude/magnitude to accomplish memory cell programming in response to control signals from the memory controller circuit 402. The voltage control circuit 404 may be coupled to voltage sources, such as a voltage source supplying voltage appropriate for a read operation ($V_{read}$), a voltage source supplying voltage appropriate for the reset operation ($V_{reset}$), and/or a voltage source supplying voltage appropriate for the set operation ($V_{set}$). Alternatively, the voltage control circuit 404 may be coupled to a single (or more) voltage source and include circuitry (e.g., a bank of resistors selectable by an array of switches) configured to enable outputting voltage pulses at selectable predetermined potentials. The voltage control circuit 404 may be configured to receive control signals from the memory controller circuit 402 to identifying the type of memory writing operation to be performed. The voltage control circuit 404 may be further configured to determine the appropriate voltage and duration of a read or programming pulse to be generated, and the circuit (e.g., bit line decoder 408 or bit line pulse application circuits 412a-412d) to which the generated pulse should be applied. For example, as part of performing a memory cell SET operation, the voltage control circuit 404 may output a pulse having the voltage $-V_{set}$, with a duration selected to cause the selected memory cells to transition to a lower resistivity state, with the pulse being connected to the appropriate bit line pulse application circuit 412a-412d. The bit line pulse application circuits 412a-412d may be a simple switch or transistor (e.g., single device driver) configured to couple the corresponding bit line to the voltage control circuit 404, such as in response to control signals from the bit line decoder 408, for the duration of the memory read or programming (i.e. set or reset) operation.

The voltage control circuit 404 may also include current limiting circuitry 414 so that the memory set or reset pulse output by the voltage control circuit 404 is applied with the current limitations determined in the various embodiments. In this embodiment, the current limiting circuitry 414 in the voltage control circuit 404 would limit the total current applied to the bit line. Alternatively, a current limiting circuit 414 may be implemented on the word line portion of the circuit through the memory element being programmed. For example, current limiting circuit 414 may be implemented as part of the word line decoder 406 or an associated circuit. Thus, while the voltage control circuit 404 may output a voltage pulse coupled to the bit line, a current limiting circuit coupled to the word line decoder 406 can limit the total current passing through the selected memory cell. Any of a variety of current limiting circuits known to those of skill in the art may be used for the current limiting circuit 414, which may be included in the voltage control circuit 404, the word line decoder 406, the bit line decoder 408, or other circuit components of the memory chip 400.

The memory control circuit 402 may be configured to control the voltage control circuit 404, bit line decoder 408, and word line decoder 406 to affect the operations of memory chip 400 in response to input/output (I/O) signals received from an external processor, such as via one or more control input leads (not shown). As discussed above, the memory control circuit 402 may control both the bit and word line decoders that are accessed for a given operation, such as read, set or reset, as well as the voltage control circuit 404 which applies the appropriate voltage for the operation.

As described more fully below, the various embodiments involve controlled application of voltages and current limitations in order to effectively implement set and reset programming of memory cell units in a multilevel memory. In order to implement the various embodiments, the memory controller circuit 402 may be configured with executable instructions (which may be implemented in software, firmware or combinations of software and firmware) to perform the operations of the embodiment methods described below. Additionally, the memory controller circuit 402 may include a memory 410 on which are stored the voltage, current and pulse width characteristics appropriate for accomplishing particular set or reset operations in accordance with the embodiments. As discussed below, such voltage, current and pulse width characteristics may be stored in a data table which can be accessed through a table lookup algorithm performed by the memory controller circuit 402.

Figure 4B:
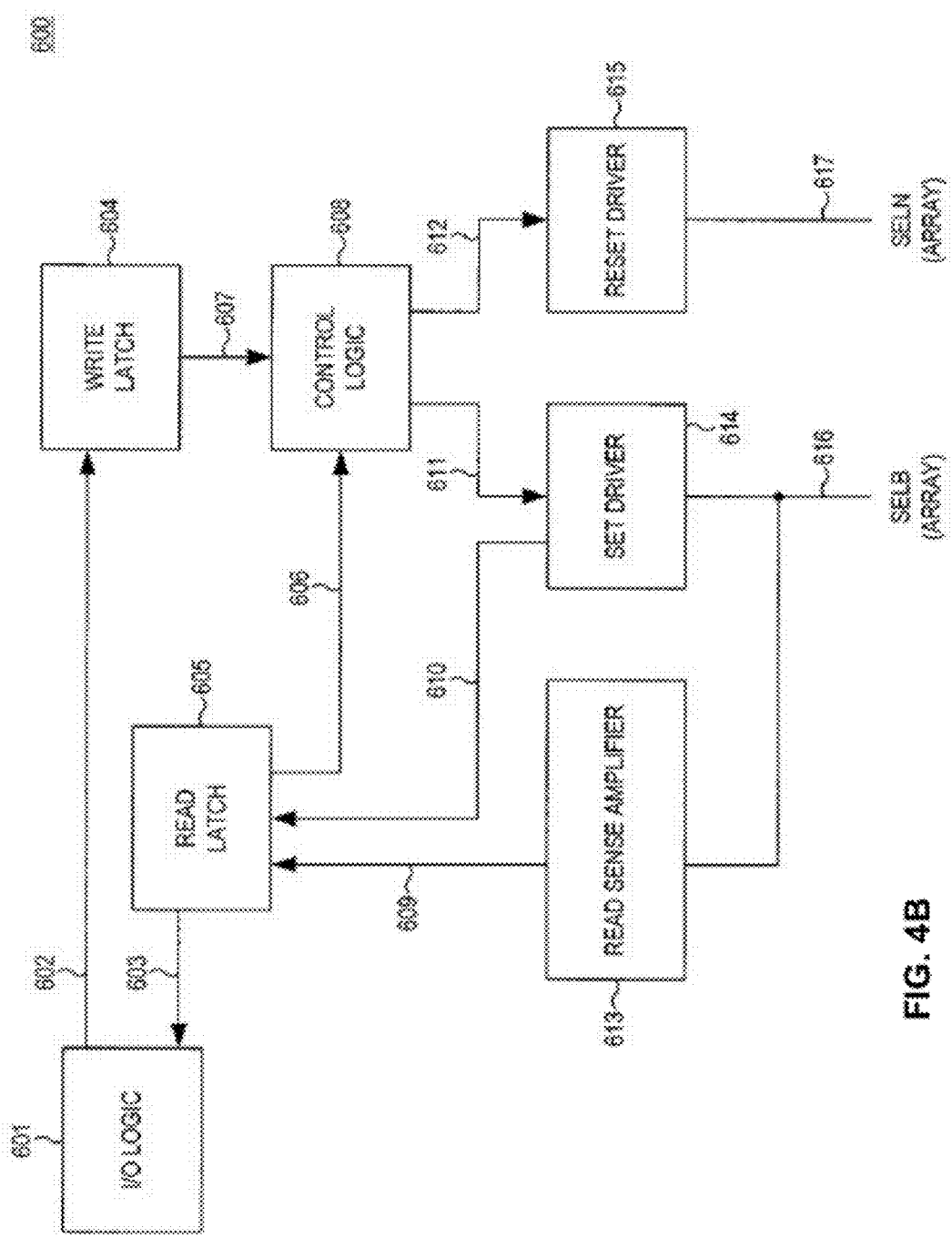

An alternative embodiment of the memory cell programming system 600 useful for implementing the various embodiment methods is illustrated in FIG. 4B. This figure shows a memory cell programming system 600 including separate circuit blocks for generating set, reset, and read mode pulses. In the embodiment illustrated in FIG. 4B, reset programming pulses are accomplished in a reverse bias (i.e., negative voltage) mode by coupling the selected bit line to a respective SELN bus line. In this embodiment, a reset driver 615 is coupled to the SELN bus 617 which represents the path to the SELN bus. In essence, this represents the path which ultimately is coupled to the SELN bus segment for a selected array block. Data information to be written is received into an I/O logic 601, conveyed on bus 602 to a write latch block 604, conveyed on bus 607 to control logic 608, which then controls the reset driver 615 by way of control lines 612. In other embodiments the set operation may be accomplished in a reverse bias mode and reset operations may be accomplished in a forward bias mode, in which case the set driver and reset driver locations in FIG. 4B are exchanged.

In the embodiment illustrated in FIG. 4B, the set data writing operation is accomplished in a forward bias (i.e., positive voltage) mode, with the selected bit lines coupled to a respective SELB bus line. Since both the SET and READ modes may utilize the forward bias mode, both a set driver 614 and a read sense amplifier 613 may be coupled to the SELB bus 616, which represents the path to the SELB bus. The resistance state of selected memory cells may be determined by a read sense amplifier 613, which determines a current or voltage drop through the cell from which the resistance can be determined when a given voltage is applied to the cell. The data determined by the read sense amplifier 613 may be conveyed by bus 609 to a read latch 605, with is conveyed by bus 603 to the I/O logic 601. The various busses 606, 610, and 611 may provide for a programming control loop which can limit the programming current to the limit determined according to the various embodiments. The busses also provide for a read before write capability to determine, for example, any previously-programmed state (e.g., LSB data bit or current resistance state) that should be preserved during a subsequent programming operation. In some embodiments the set driver 614 and reset driver 615 may be included in the voltage control circuit 404 of FIG. 4A, and busses 616 and 617 connect 404 to the pulse line application circuits 412a-412d.

Further details regarding the circuit elements of the memory cell programming system associated with reading and programming resistance memory cells are disclosed in U.S. Pat. No. 7,463,536 which is hereby incorporated by reference for the disclosures of such circuit elements.

In some embodiments the foregoing description of the circuits in FIG. 4A, references to the connections of the voltage control circuit 404 to bit lines via bit line pulse application circuits 412a-412d is for illustration purposes only. In an alternative configuration, the voltage pulses may be applied by a voltage control circuit 404 to word lines in a similar manner. It should also be appreciated that the particular circuit elements illustrated in FIGS. 4A and 4B discussed above are examples of just two implementations of the various embodiments; one of skill in the art would appreciate that the embodiments may be implemented in a variety of different circuit and components configurations.

While metal oxide resistance memory cells are low cost and can be manufactured in a dense cell array, the memory density of the array can be increased significantly by increasing the number of memory states that each cell can attain. Initially, resistance memory arrays cells had two states, namely a low resistance state and a high resistance state. However, the various embodiments enable memory cells to be programmed with multiple resistance states, thereby increasing the number of bits that can be coded in each memory cell 100. For example, the various embodiments are described herein with reference to a memory cell that is programmed with four different states resistivity states, thereby enabling the storage of two bits of information (namely 00; 01; 10; and 11). This is accomplished by using the set and reset programming methods to configure the resistance element 102 so that it has four detectable resistance states.

Figure 5:
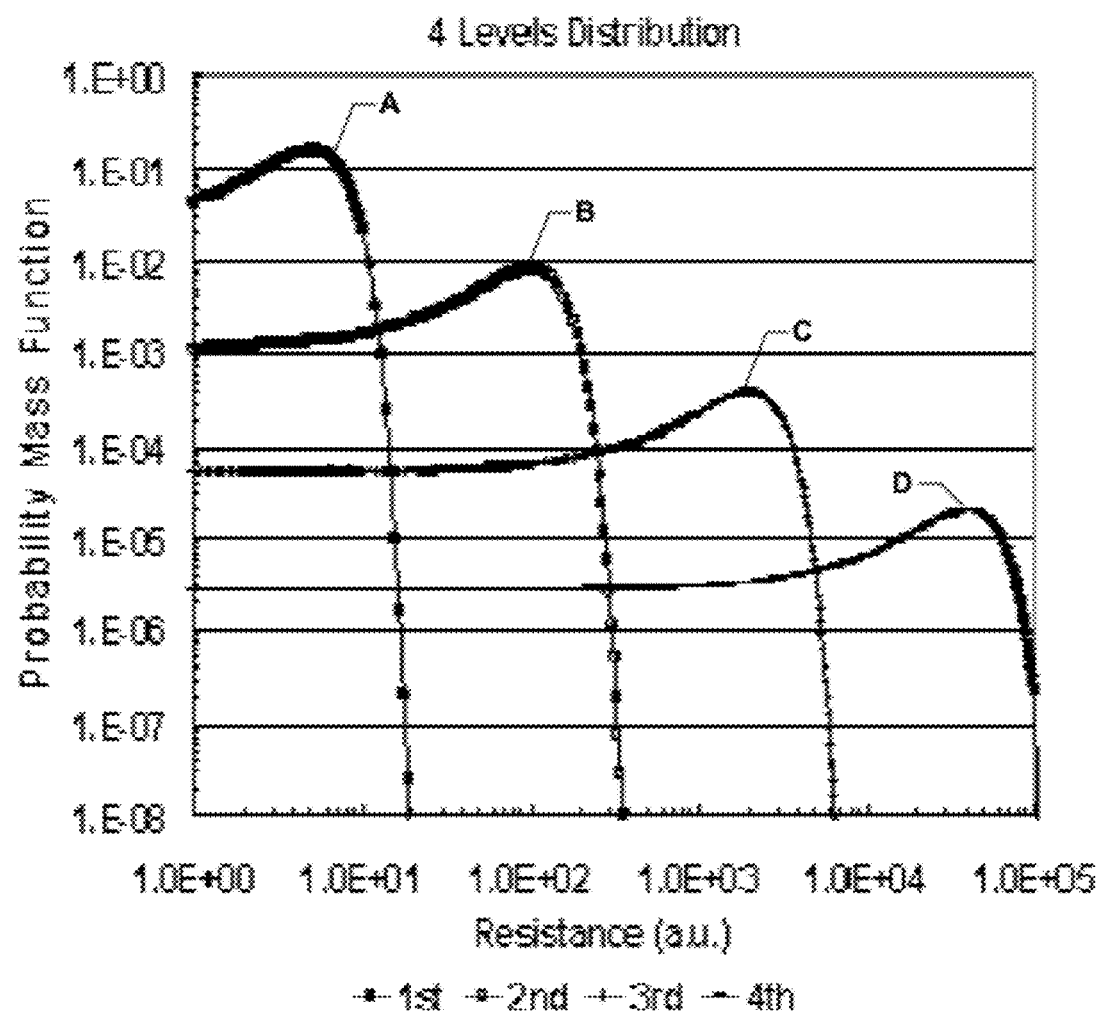
FIG. 5 is a graph illustrating the population of memory element resistivity states in a metal oxide multi-level memory cell.
Figure 6:
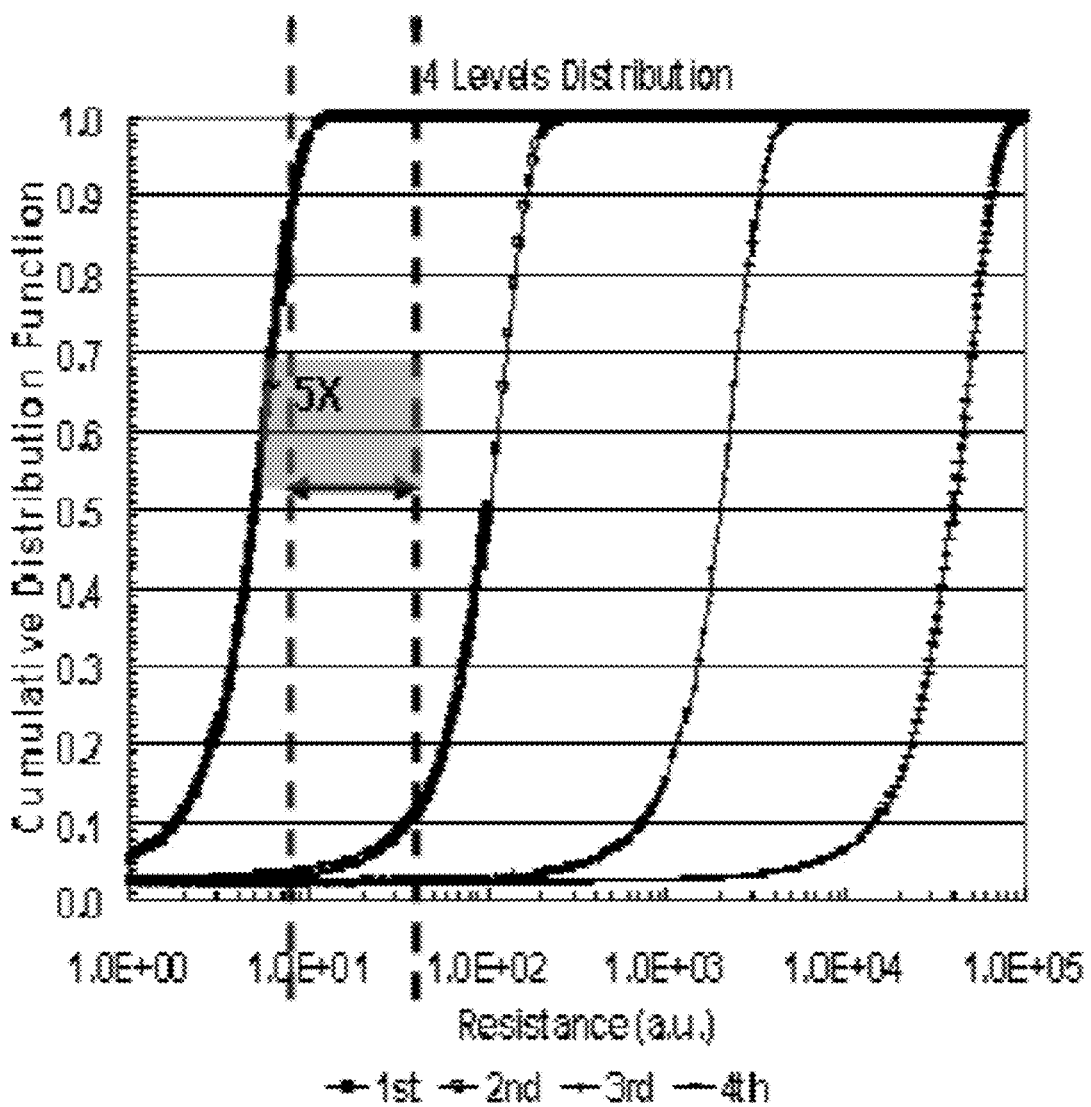
FIG. 6 is a graph illustrating a cumulative distribution function of memory element resistivity states in a metal oxide multi-level memory cell.

A multilevel memory cell implementing a suitable variable resistance switching element can achieve a plurality of different resistance states with sufficiently different levels of resistance to enable the state to be accurately sensed by a resistance or current sensor in a memory cell. For example, FIG. 5 shows the probability function of resistance values of a variable resistance switching element employing a $HfO_2$ layer such as described above with reference to FIG. 2 that has been programmed to four distinct resistance levels A, B, C, D. As FIG. 5 illustrates, applying the set and reset methods of the various embodiments enables configuring a majority of $HfO_2$ memory cells to recognizable resistance states. FIG. 6 illustrates the cumulative distribution function of a $HfO_2$ layer that has been programmed to four distinct resistance levels A, B, C, D. As FIG. 6 illustrates, the population distribution within particular resistance states of such a memory cell and the difference in resistivity between the resistance states provides sufficient margin to enable a high probability that a memory cell programmed into a particular memory state can be recognized accurately. This margin between mean or objective resistance states can accommodate variability in the resistance state achieved in a programming operation. If the resistance of a memory cell falls between a minimum resistance threshold and a maximum resistance threshold for a given resistance state, the memory cell will be recognized as being in that resistance state. Thus, the embodiment methods determine programming pulse characteristics (i.e., voltage, current and duration) that are expected to result in the memory cell exhibiting resistance which falls within the maximum and minimum threshold limits for the objective resistance state (i.e., the desired resistance).

Figure 7:
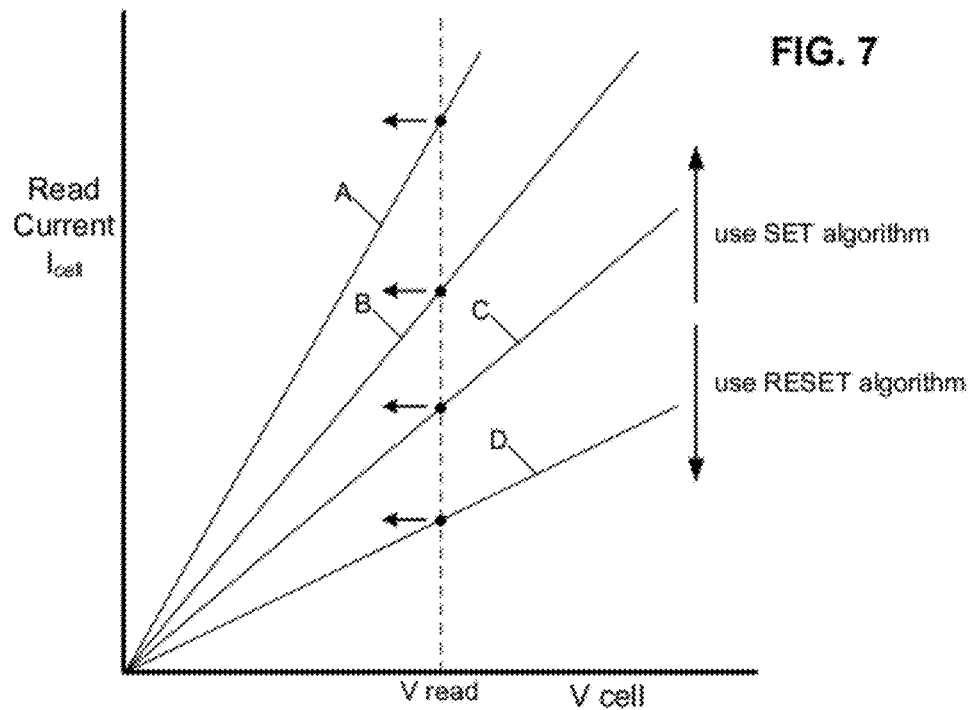
FIG. 7 is a graph illustrating differences in the read current in a four level multi-level cell memory element at a given read voltage.

The memory state of a multilevel metal oxide resistive memory can be read by applying a read voltage ($V_{read}$) to the cell and measuring the resulting current (the read current or $I_{cell}$) through the memory cell. As illustrated in FIG. 7, due to the significant difference in resistance between the various resistance states (see FIG. 6), the differences in read current that can be sensed for each resistance state are great enough to enable accurate determination of the memory state. This difference in the current can be increased if necessary by increasing the read voltage $V_{read}$ applied to the cell in the read operation.

Accurate reading of the memory state of the multilevel metal oxide resistive memory may also be increased by determining the read state based on a sequence of threshold comparisons rather comparing the read current (or calculated resistance) to a predefined state. For example, the read operation may involve first determining whether the read current is greater than a first threshold value ($I_1$). If the read current is less than the first threshold value $I_1$, then the memory cell may be determined to be in a first memory state (state D in FIG. 7). If the read current is greater than the first threshold value, the read operation may determine whether the read current is greater than a second threshold value ($I_2$). If the read current is less than the second threshold value $I_2$, then the memory cell may be determined to be in a second memory state (state C in FIG. 7). If the read current is greater than the second threshold value, the read operation may determine whether the read current is greater than a third threshold value ($I_3$). If the read current is less than the third threshold value $I_3$ then the memory cell may be determined to be in a third memory state (state B in FIG. 7). If the read current is greater than the third threshold value, then the memory cell may be determined to be in a fourth memory state (state A in FIG. 7). This sequential comparison of the read state to successive threshold current values can accommodate the inevitable distribution in resistance states that a large population of memory cells will exhibit by efficiently identifying the maximum and minimum resistance thresholds within which the memory cell resistance falls.

The programming of metal oxide elements into various resistance states in a resistance random access memory device can be difficult, presenting technical challenges for implementing such devices commercially. Such difficulties are due in part to the inverse relationship between resistance and current, and the manner in which resistive elements are transitioned to new resistance states. When a set programming voltage pulse is applied to transition the metal oxide to a lower resistance state, the applied current can increase dramatically as resistance falls due to Ohm's Law: I=V/R. Since the power dissipated within the memory resistance element is strongly related to current under Joule's Law $P=I^2R$, a rapid increase in current through the memory element that may occur as the element transitions to lower resistance can result in a significant increase in the power dissipated by the memory element. This can induce heating stress in the memory element. In some devices, runaway heating can lead to further reductions in the resistivity of the device, causing further increases in current and heating that can lead to runaway of the programming of the memory element. If not controlled, such runaway heating can reduce the lifespan of the memory and lead to device failure.

To overcome these difficulties, the various embodiments control both voltage and current simultaneously during the programming pulse used in the set operation (i.e., when transforming the memory cell to a lower resistance state) in a balanced operation. In a set programming operation, the embodiment methods select a voltage required to achieve the desired resistance state but limit the current passing through the memory element to a preset amount depending upon the programming state that is desired. In a reset programming operation where resistance is increased, a similar approach is used with the embodiment methods selecting a voltage required to achieve the desired resistance state and may adjust the current passing through the memory element to compensate for the increasing resistance. In this balanced approach the operation voltage and current limits are set to approximately balance each other. As a result the operation power may be maintained close to constant as the resistance of the memory cell is reduced or increased. The balanced approach may further be implemented by varying the programming pulse width. In some embodiments, pulses of predefined voltage with predefined current limits may be applied in a series of pulses in order to approach the desired programming state of the resistance in a controlled manner. For example, in this embodiment the set operation may comprise a series of pulses of increasing voltage and decreasing current configured to incrementally transform the resistive state of the memory elements. In other embodiments, the programming of a memory element to a particular resistance state may further involve sensing the resulting resistance of the element, and re-applying the programming pulse if the desired resistivity level was not achieved.

The various embodiments are based upon an understanding of how metal oxide materials behave in response to voltage and current, as well as an understanding of the physical mechanisms involved in changing the resistivity levels of such materials. For certain metal oxide materials it is believed that the resistance state depends upon the location of oxygen atoms within the metal oxide microstructures. Thus, transitions from one level of resistance to another may result from the diffusion of oxygen atoms within the crystal structure of the metal oxide. Diffusion is generally proportional to the driving potential (i.e., voltage), time and the concentration gradient. The rate of diffusion of oxygen atoms may also be influenced by the temperature of the material. Based on this understanding, the appropriate combinations of applied voltage, pulse duration and maximum current can be determined via an algorithm with confidence that the resulting resistance state can be repeatedly achieved with high probability.

Figure 8:
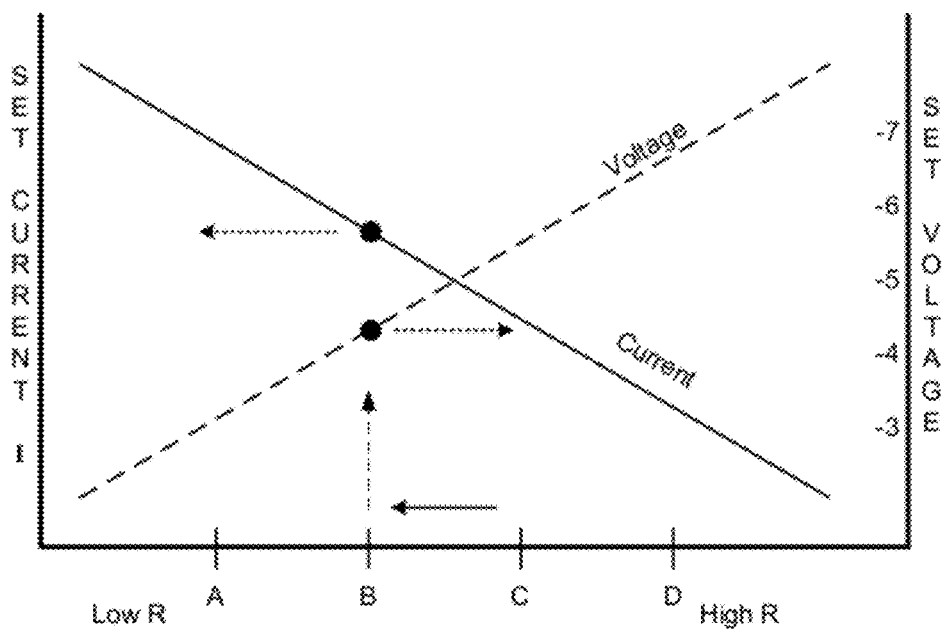
FIG. 8 is a graph illustrating determining a set programming voltage and current according to an embodiment.

The various embodiments implement the algorithm for determining the appropriate voltage and current limits to apply to the set and reset programming pulses. Such algorithms may lookup values from a table that may be populated with values determined through design, experimentation or combinations of design and experiments. Such algorithms determine the voltage and current limits that will result in a high likelihood that a particular program memory element will achieve the desired resistivity state. FIG. 8 illustrates in graphical form a notional algorithm for determining the pulse electrical characteristics for the set operation. FIG. 9 similarly illustrates in a notional form the algorithm for voltage settings for determining the pulse electrical characteristics for the reset operation. As FIGS. 8 and 9 illustrate, the algorithm can determine the appropriate voltage and current parameters by selecting the resistance that is desired for a programming operation. These figures illustrate that a large number of different programming states may be implemented for a metal oxide resistance memory element by selecting a corresponding number of resistivity states. The algorithms illustrated in FIGS. 8 and 9 show how the programming pulse parameters can be determined based on the desired resistivity state. The magnitude and slopes of the voltage and current limit lines will depend upon the particular type of metal oxide used in the memory elements, as well as other characteristics, such as the dimensions of the metal oxide layers. As mentioned above, the slopes and magnitudes of the voltage and current lines used in the algorithm may be determined based on the type of metal oxide and size of the resistance element, as well as testing of memory cells in the configuration of the intended memory chip.

Since a memory chip will be typically limited to a predefined number of levels or resistivity states (or number of bits stored per memory cell), the algorithm for determining voltage and current limits may be implemented in a data table that can be accessed in a table lookup algorithm, such as by a memory controller circuit or processor. An example data structure for such a programming voltage and current parameter determination algorithm is illustrated in FIGS. 10A and 10B.

Referring to FIG. 10A, the various embodiments may be implemented with predefined programming voltage and current levels stored in a data table with a simple data structure that enables the memory controller to quickly identify appropriate voltage and current values simply by performing a table lookup using the desired memory state as an input. For example, FIG. 10A illustrates a data table suitable for a four level multilevel cell configuration, with the different levels identified as A, B, C, D. As illustrated, the voltage and current settings will depend upon whether the memory state is being programmed using the set or reset operation. For example, if the processor determines that a memory cell is to be written to the A state (e.g., to write the value 11 to the memory cell), this programming would involve the set operation since the cell is already at a higher resistance state. Referring to the table the processor determines that the set programming pulse should have a voltage of value $V_{set}3$ with a current limit of $I_{set}3$. The specific voltage used and current used for the programming operation will depend upon the metal oxide material and its configuration. For example, neglecting the voltage drop of the steering element, a suitable programming voltage for configuring a memory cell into the lowest resistance state may be −2.0 volts, with a current limit of 100 microamps. The suitable programming voltage may in addition take into account the steering element voltage drop. As FIG. 10A illustrates, there is no need for a reset voltage or reset current for the lowest resistance state since there could be no reset operation to achieve this state.

As illustrated in FIG. 10A, the magnitude of the value specified for the set voltage decreases as the memory cell is transformed from a relatively high resistance state to a relatively low resistance state. Similarly, the current limit utilized in the set operation will increase from the current four programming a relatively high resistance state to programming a relatively low resistance state. As noted above, the set and reset pulse voltages may be of opposite polarity, so FIGS. 10A and 10B show the relative magnitudes of the absolute value of the voltages.

As illustrated in FIG. 10A, the values for reset voltage and current limits may follow a pattern that is opposite that of the set operation, with the reset pulse voltage increasing and the current decreasing as the memory cell is transform to a higher resistance state. For example, neglecting the voltage drop of the steering element, a suitable programming voltage for configuring a memory cell into the highest resistance state may be 5.0 volts, with a current limit of 5 microamps.

In addition to controlling the voltage and current to achieve a particular resistivity programming state, some embodiments may also vary the pulse width that is applied depending upon the desired memory state. By controlling the pulse width, the memory programming operation can control the duration that the voltage potential is applied which will control the amount of atomic diffusion that takes place within the memory cell material during the programming pulse, as well as the amount of power that is deposited in the memory cell. For example, as the resistivity of the memory cell increases, the diffusion rate of oxygen atoms within the metal oxide may decrease for a given applied potential due to changes in the oxygen ion population gradient, resulting in a need to increase the duration that the voltage potential is applied to achieve a desired resistance state.

Additionally, the programming pulse voltage and pulse width may be adjusted together to achieve desired resistance states, thereby reducing the total voltage that must be applied to the memory cell. Increasing the pulse width in order to reduce the magnitude of the applied voltage may extend the life of the memory cell and/or enable increased cell density by reducing the amount of insulation required between each memory cell. FIG. 10B illustrates an example data structure for a programming algorithm lookup table that includes the pulse width parameter.

As mentioned above, a further option for limiting the applied voltage in a set or reset programming pulse involves applying more than one pulse or a series of pulses with varying voltage and current settings. Such parameters may also be listed in a lookup data table with a structure similar to that shown in FIGS. 10A and 10B with additional data fields specifying the number of pulses and/or the voltage, current and pulse width settings for each of the series of pulses.

In an embodiment implementing a data table of voltage and current limitations, the various methods involve determining the resistivity state or memory state to be programmed, and then identifying in a table lookup algorithm the corresponding voltage and current limits to be applied in programming pulses to achieve that state. Before the table lookup algorithm is performed, the programming method must first determine whether the programming operation is going to be a set operation or a reset operation.

As mentioned above, the set operation results in the resistance of the memory cells being reduced, while the reset operation results in increased in the memory cell resistant. To determine which of these two operations is to be applied for a particular programming step, the memory (or a controller controlling the memory) may first determine the current state of the memory cell. In some implementations, the current memory state may be stored in another memory, such as in a local cache memory. For example, before writing data to a resistance memory, the data stored in the memory may be temporarily copied to a local buffer, from which the current memory state of any cell can be determined. In other implementations, the current resistance state for a memory cell may be determined by reading the memory cell in a read operation (or similar operation) before the data is written to the cell. Then, depending upon whether the next memory state will have greater or less resistance, the appropriate set or reset operation is selected. This is illustrated in FIG. 7 which shows by the vertical arrows that if the desired programming operation involves transforming the cell to a lower resistance state, such as writing memory state C to a memory cell currently in state D as illustrated, a set operation is to be performed. Similarly, if the desired programming operation involves transforming to a higher resistance state, such as writing memory state D to a memory cell currently in state C as illustrated, a reset operation is to be performed.

To summarize the various embodiments, the memory writing operation involves receiving information to be written to a memory cell (e.g., two bits of data), determining the memory state to which corresponds to the data to be written (i.e., mapping the data to a memory state), determining the current state of the memory cell (e.g., by reading the memory cell), determining whether a set or reset operation is required to move from the current memory state to the desired memory state, performing an algorithm (e.g., a table lookup algorithm) to determine the appropriate voltage and current limits that should be applied in a programming pulse (or pulses) to achieve the desired transition, electrically coupling the memory cell to be programmed to a pulse generator, and applying the programming pulse(s) with the determined voltage and current limits. As mentioned above, an additional step may involve measuring the resulting resistance state in order to determine whether the programming pulses actually transformed the memory cell to the required resistance level, and reapplying the same programming pulse if it is determined that the memory cell was not adequately programmed. Three embodiment methods suitable for use with four-level multilevel resistance memory cells are described in more detail below with reference to the process flow diagrams illustrated in FIGS. 11 through 13.

Figure 11:
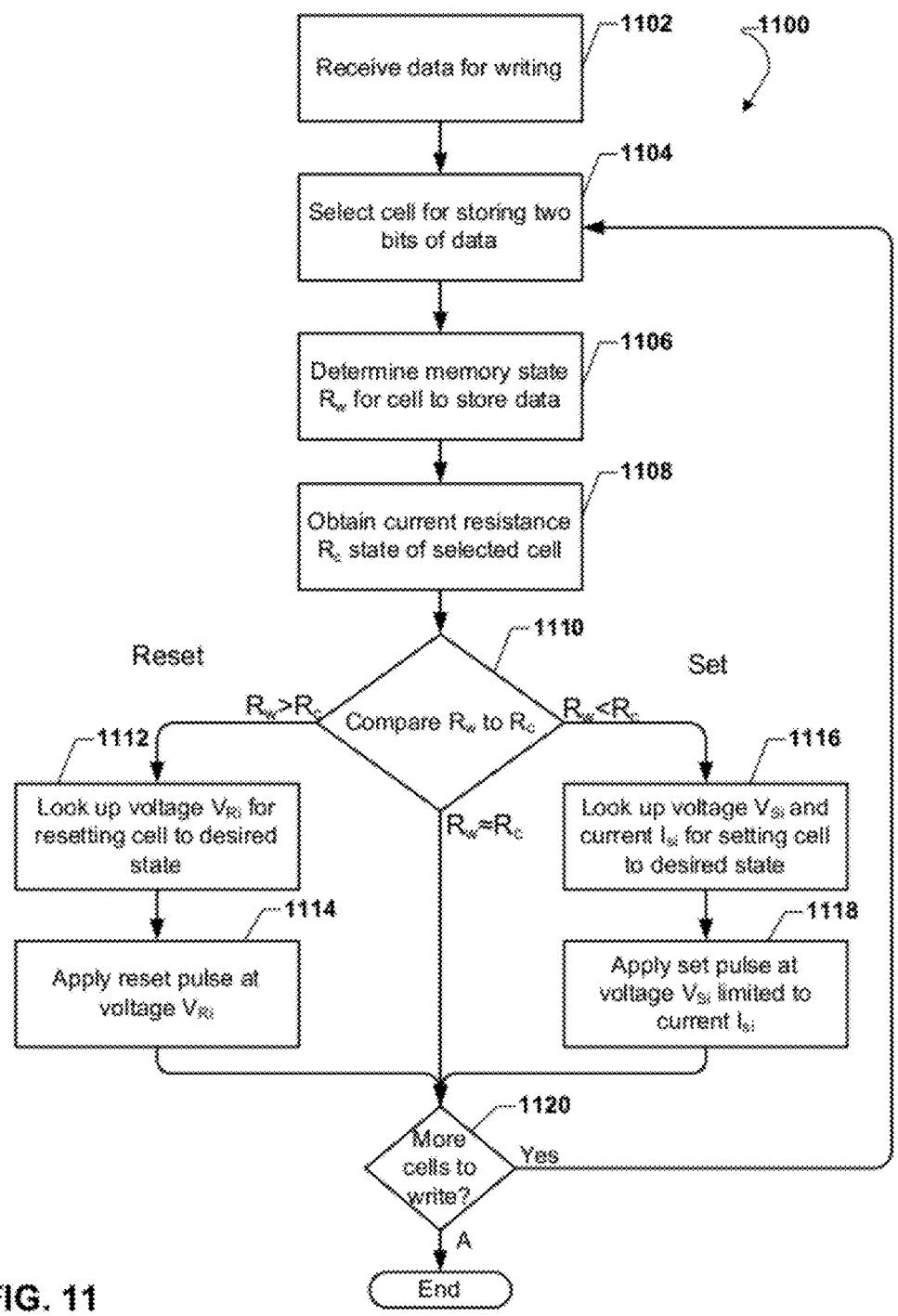
FIG. 11 is a process flow diagram of an embodiment method for programming a bipolar metal oxide multi-level cell memory.

A first embodiment method 1100 for writing data to a metal oxide multilevel cell memory is illustrated in FIG. 11. The process of writing data to the memory cell may begin with receiving data to be written to the memory in step 1102, and selecting the cells for storing data in step 1104. These operations may proceed in a conventional manor with the exception that more than one bit of information will be identified for storing in an individual memory cells in a multilevel cell memory. For example, if the memory cell is configured with four different memory states, step 1104 may involve selecting cells to store two bits of data. In an eight level multilevel cell memory, this step may involve selecting a particular cell to store three bits of data. In step 1106, which may be performed as part of selecting cells for storing data step 1104, the memory state corresponding to the data to be stored is determined. Since this parameter is determined at the time that the memory is designed, this may be accomplished in hardware, such as in an addressing circuit.

In step 1108, the memory controller circuit (or processor) may determine the current resistance or memory state of the selected cell. In some implementations, this information may be determined by accessing data stored in another memory, such as a cache memory. When the current state of the memory cell is not otherwise known, step 1108 may involve performing a read operation on the selected cell or otherwise measuring the current resistance state of the cell. In determination step 1110, the memory controller circuit (or processor) may compare the desired resistance or memory state to the current resistance or memory state of the cell to determine whether a set or reset operation is to be performed. As discussed above, if the desired resistance is greater than the current resistance (i.e., $R_w > R_c$) then a reset operation is to be performed, otherwise (i.e., $R_w < R_c$) a set operation is to be performed. This determination step 1110 may also determine whether the memory cell is currently already in the desired state (i.e., $R_w \approx R_c$), in which case there is no need to write the data to the memory cell, and the data writing operation may be skipped.

If it is determined that a reset operation is to be performed (i.e., $R_w > R_c$), the memory control circuit (or processor) may perform a table lookup to determine the voltage and current for resetting the memory cell to the desired resistance state in step 1112. Since the reset operation involves transforming the cell to a higher resistance state, there is less concerned about a runaway current situation damaging the cell. Therefore, this table lookup operation in step 1112 may simply determine the programming pulse voltage and not impose current restrictions. In step 1114, a programming pulse of the determined voltage and current is applied to the selected cell.

If it is determined that a set operation is to be performed (i.e., $R_w<R_c$), the memory cell circuit (or processor) may perform a table lookup to determine the voltage and current for setting the memory cell to the desired resistance state in step 1116. In step 1118, a programming pulse of the desired voltage and current limit is applied to the selected cell.

Once the selected cell has been programmed in step 1114 or step 1118, or determined to already be in the desired memory step (i.e., $R_w \approx R_c$), the memory controller circuit (or processor) may determine whether there are more cells to be written with data in determination step 1120. If so (i.e., decision step 1120="Yes"), the operation may return to step 1104 to select the next cell for writing data, with the process continuing as described above. Once all cells have been written with data (i.e., determination step 1120="No"), the data writing operation may end. In some embodiments the memory system applies an erase operation to pages of data in the memory device. For example, the erase operation may program all cells to state A or D prior to data programming. In an erase operation step 1108 described above is optional since the desired memory state is an extreemum of the possible states. In this case, decision step 1110 may be inferred from the desired erase state. In these embodiments the programming method of FIG. 11 and FIG. 12 may be simplified because step 1108 is optional and step 1110 compares to the erase state.

Figure 12:
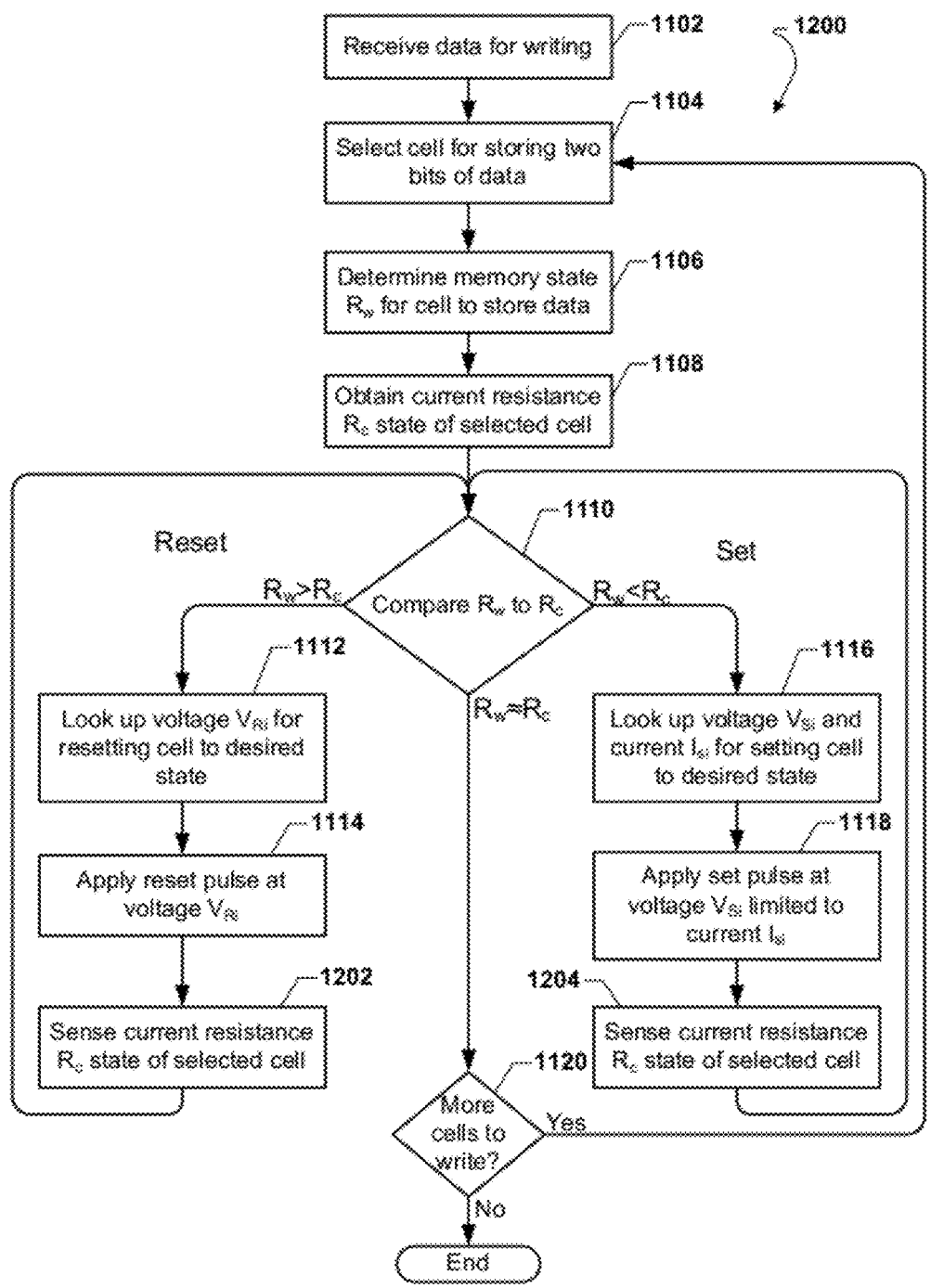
FIG. 12 is a process flow diagram of another embodiment method for programming a bipolar metal oxide multi-level cell memory.

A second embodiment method 1200 for writing data to a metal oxide multilevel cell memory illustrated in FIG. 12 includes a step of sensing the programmed memory cell to confirm that it is achieved the desired resistance state. As described above with reference to FIG. 11, the process of writing of data to the memory cell may begin in a conventional manner with the receipt of data to be written to the memory in step 1102, and selection of a particular cell for storing data in step 1104. In step 1106, the resistance or memory state corresponding to the data to be stored is determined. In step 1108, the current resistance or memory state of the selected cell is determined, such as by performing a read operation on the cell. In determination step 1110, the memory controller circuit (or processor) may compare the desired resistance or memory state to the current resistance or memory state of the memory cell to determine whether a set or reset operation is to be performed.

If it is determined that a reset operation is to be performed (i.e., $R_w>R_c$), the memory control circuit (or processor) may perform a table lookup to determine the voltage and current for resetting the memory cell to the desired resistance state in step 1112. In step 1114, a programming pulse of the determined voltage and current is applied to the selected cell. In step 1202, the programmed memory cell may then be sensed to determine its current resistance state resulting from the programming pulse. The process flow may then return to determination step 1110 wherein the sensed resistance state $R_c$ may be compared to the desired resistance state $R_w$ to determine if the cell has been properly programmed. If the sensed resistance state $R_c$ after programming approximately equals the desired resistance state $R_w$ (e.g., the sensed resistance falls within the required resistance threshold limits for the objective resistance state) then programming of the memory cell is complete and the process may proceed to determination step 1120. On the other hand, if the sensed resistance state $R_c$ does not approximately equal the desired resistance state $R_w$, indicating that the cell was not properly programmed, the process of determining the appropriate programming voltage in step 1112, applying a pulse with that determined voltage in step 1114, and sensing the resulting resistance state in step 1202 may be repeated. The process of programming and testing the resulting resistance that state may continue until the desired resistance state is achieved (i.e., $R_w \approx R_c$).

If it is determined that a set operation is to be performed (i.e., $R_w<R_c$), the memory cell circuit (or processor) may perform a table lookup to determine the voltage and current for setting the memory cell to the desired resistance state in step 1116. In step 1118, a programming pulse of the desired voltage and current limit is applied to the selected cell. In step 1204, the programmed memory cell may then be sensed to determine its current resistance state resulting from the programming pulse. The process flow may then return to determination step 1110 where the sensed resistance state $R_c$ may be compared to the desired resistance state $R_w$ to determine if the cell has been properly programmed. If the sensed resistance state $R_c$ after programming approximately equals the desired resistance state $R_w$ (i.e., $R_w \approx R_c$), then the programming of the memory cell is complete and the process may proceed to determination step 1120. On the other hand, if the sensed resistance state $R_c$ does not approximately equal the desired resistance state $R_w$, indicating that the cell was not properly programmed, the process of determining the appropriate programming voltage in step 1116, applying a pulse with that determined voltage in step 1118, and sensing the resulting resistance state in step 1204 may be repeated. The process of programming and testing the resulting resistance that state may continue until the desired resistance state is achieved (i.e., $R_w \approx R_c$).

Once it is determined that the selected cell has been properly programmed or is already in the desired memory step (i.e., $R_w \approx R_c$), the memory controller circuit (or processor) may determine whether there are more cells to be written with data in determination step 1120. If so (i.e., decision step 1120="Yes"), the operation may return to step 1104 to select the next cell for writing data, with the process continuing as described above. Once all cells have been written with data (i.e., determination step 1120="No"), the data writing operation may end.

It should be noted that embodiment method 1200 can detect and correct for situations where the programming pulse results in an overshoot (i.e., a greater increase or decrease in resistance than desired) since returning to determination step 1110 enables the programming operation to apply either a set or reset as necessary to adjust the resistance of the memory cell to the objective value.

Figure 13:
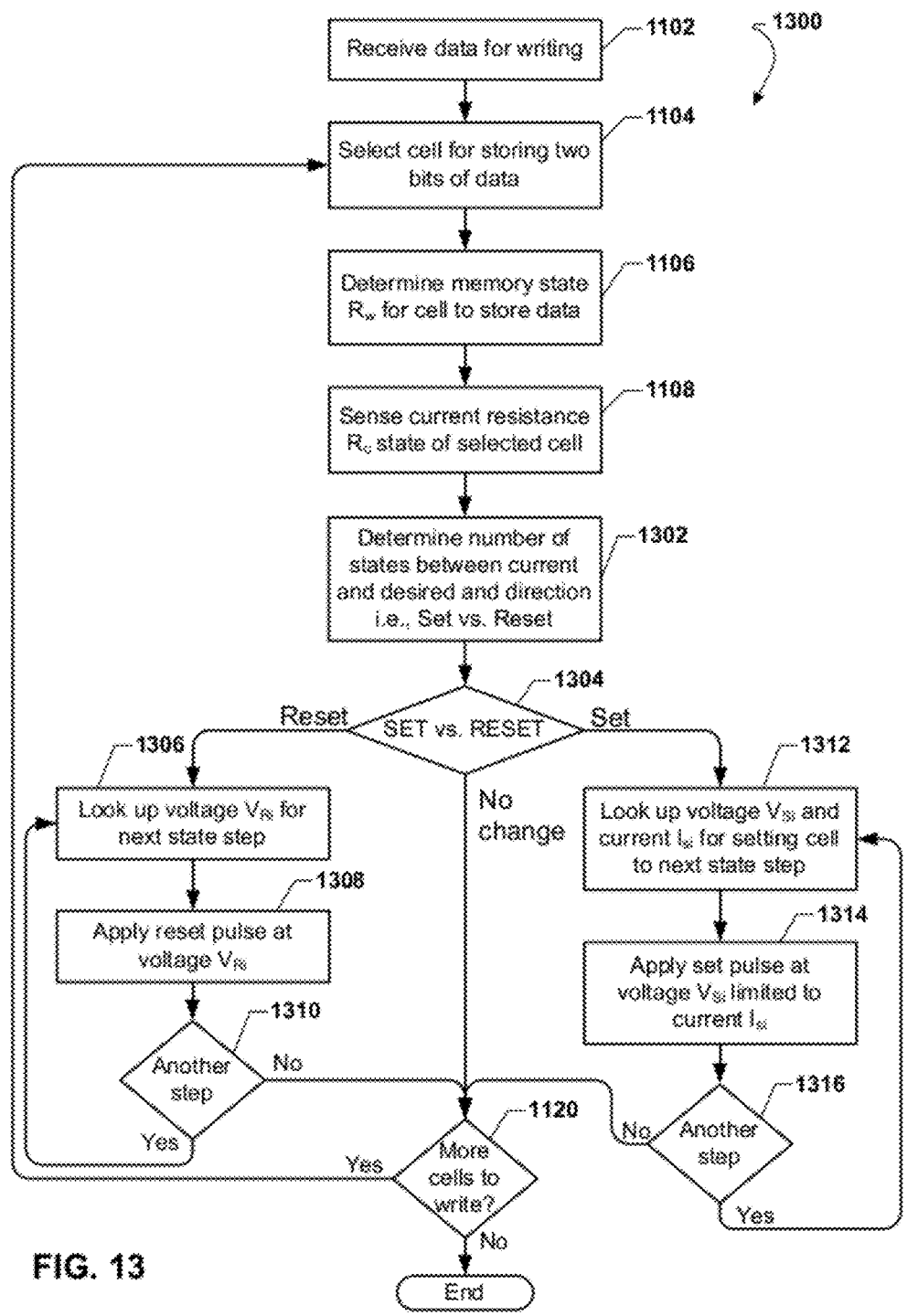
FIG. 13 is a process flow diagram of another embodiment method for programming a bipolar metal oxide multi-level cell memory.

A third embodiment method 1300 for writing data to a metal oxide multilevel cell memory involving multiple programming pulses is illustrated in FIG. 13. As described above with reference to FIG. 11, the writing of data to the memory cell may begin in a conventional manner with the receipt of data to be written to the memory in step 1102, and selection of a particular cell for storing data in step 1104. In step 1106, the resistance or memory state corresponding to the data to be stored is determined. In step 1108, the current resistance or memory state of the selected cell is determined, such as by performing a read operation on the cell.

In step 1302, the memory control circuit or processor may determine the number of programming steps or states between the current resistance state and the desired resistance state. This determination of the number of programming steps to be implemented may be accomplished using a table lookup algorithm similar to that described above with reference to FIGS. 10A and 10B. For example, the memory may be configured to move from one resistance state to the next in a serious of two or more pulses. As another example, the memory may be configured to transform the memory cell incrementally from one resistance state to the next until the desired memory state is achieved. Thus, if the selected memory cell is currently in state D and the objective memory state is state A, the memory control circuit may determine in step 1302 that three programming pulses will be required, namely transforming from state D to state C, followed by transforming from state C to state B, and finally transforming from state B to state A. As part of step 1302, the direction of these transformations (i.e., set or reset) may be determined. In determination step 1304, the memory controller circuit (or processor) selects either the set or reset operations, or skips the memory writing operation if the memory cell is already in the desired resistance state.

If it is determined that a reset operation is to be performed, the memory control circuit (or processor) may perform a table lookup to determine the voltage and current for resetting the memory cell to the next resistance state in step 1306. As discussed above, this next resistance state may not be the ultimately desired state when more than one programming step is to be implemented. In step 1308, a programming pulse of the determined voltage and current is applied to the selected cell. In determination step 1310, the programmed memory cell may determine if another programming step is to be implemented based on the number of states determined in step 1302. If another programming step is to be implemented (i.e., determination step 1310="Yes"), the process may return to step 1306 to perform a lookup operation to identify the voltage and current for the next programming step, followed by application of the reset pulse with the determined voltage step 1308. Once all of the programming steps have been accomplished (i.e., determination step 1310="No"), the process may return to determination step 1120 to determine whether there are more cells to be written.

If it is determined that a set operation is to be performed, the memory control circuit (or processor) may perform a table lookup to determine the voltage and current for resetting the memory cell to the next resistance state in step 1312. As discussed above, this next resistance state may not be the ultimate objective state when more than one programming step is to be implemented. In step 1314, a programming pulse of the determined voltage and current is applied to the selected cell. In determination step 1316, the programmed memory cell may determine if there is another programming step to be implemented based on the number of states determined in step 1302. If another programming step is to be implemented (i.e., determination step 1316="Yes"), the process may return to step 1312 to perform a lookup operation to identify the voltage and current for the next programming step, followed by application of the reset pulse with the determined voltage step 1314. Once all of the programming steps have been accomplished (i.e., determination step 1316="No"), the process may receive to determination step 1120 to determine whether there are more cells to be written.

Once the selected cell has been properly programmed or determined to be in the desired memory step (i.e., $R_w \approx R_c$), the memory controller circuit (or processor) may determine whether there are more cells to be written with data in determination step 1120. If so (i.e., decision step 1120="Yes"), the operation may return to step 1104 to select the next cell for writing data, with the process continuing as described above. Once all cells have been written with data (i.e., determination step 1120="No"), the data writing operation may end.

References herein to word lines and bit lines is not intended to limit the scope of the invention to particular methods of accessing the data stored in such a memory array. In other words, both bit lines and word lines may be alternatively "driven" or "sensed." Also, no preferred memory organization in terms of bits the words is intended or implied, and word line and bit line organizations of the memory array may be easily reversed.

References herein to selecting a particular memory cell, bit line or word line are for illustration purposes and are not intended to limit the embodiments to programming one memory cell at a time. To the contrary, the various embodiments may also be implemented for writing blocks of data concurrently, or writing a single data state to a block or memory cells simultaneously, such as to reset the memory to all zeros or another value. Such block writing may be accomplished by selecting a block of memory cells for programming, determining electrical characteristics for a programming pulse to achieve the objective resistance state for all selected cells and then applying the programming pulse or pulses to all selected cells simultaneously or sequentially. Such block programming may be particularly useful when the data writing operation involves a reset since the increasing resistance of such a transformation will inhibit runaway currents through the selected programming pulse or pulses.

In the foregoing description, the directionality of word lines and bit lines shown in the figures in the descriptions is merely for ease of description. No particular orientation is intended or implied. Also, while word lines and bit lines are usually orthogonal as illustrated in the figures, such an orientation of word lines and bit lines is not necessary, and non-orthogonal geometries may be implemented.

As those of skill in the art would appreciate, the assignment of bit values to different resistivity levels in a multi-level cell is arbitrary and the various method may be implemented using a different resistance-to-bit mapping than mentioned in the foregoing descriptions of the embodiments. Further, the polarity of programming pulses are arbitrary and the methods and circuits for applying programming pulses may be varied without departing from the scope of the claims.

The methods and processes of the various embodiments may be implemented in hardware in the form of circuit elements, in software executed in a processor (e.g., a processor circuit within a memory chip or memory driver component), or in combinations of hardware and software. For example, a combination of a programmed processor coupled to circuit elements may be configured to execute an embodiment method.

The process flow diagrams shown in FIGS. 11-13 and the foregoing method descriptions are provided merely as an illustrative example and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of writing data to a multilevel cell resistance memory device, comprising:
   receiving data to be written to the memory device;
   selecting a memory cell to which at least a portion of the received data is to be written;
   determining a current resistance state of the selected memory cell;
   determining an objective resistance state for representing data to be written to the selected memory cell;
   determining whether the writing of data to the selected memory cell will involve increasing or decreasing resistance of the selected memory cell based on the current resistance state and the objective resistance state;
   determining electrical characteristics for a programming pulse that will transform the resistance state of the selected memory cell to the objective resistance state based on the objective resistance state and whether the writing of data to the selected memory cell will involve increasing or decreasing resistance of the selected memory cell; and
   applying to the selected memory cell a programming pulse having the determined electrical characteristics;
   wherein the electrical characteristics of the programming pulse are configured to control both a current and a voltage of the memory cell to maintain substantially constant power dissipation in the selected memory cell while applying the programming pulse to the selected memory cell.

2. The method of claim 1, wherein determining electrical characteristics for a programming pulse comprises determining a voltage and a current limit for the programming pulse.

3. The method of claim 1, wherein determining electrical characteristics for a programming pulse comprises determining a voltage and a current limit for the programming pulse when it is determined that the writing of data to the selected memory cell will involve decreasing resistance of the selected memory cell, and determining a voltage for the programming pulse when it is determined that the writing of data to the selected memory cell will involve increasing resistance of the selected memory cell.

4. The method of claim 1, further comprising:
   determining a duration for a programming pulse based on the objective resistance state and whether the writing of data to the selected memory cell will involve increasing or decreasing resistance of the selected memory cell,
   wherein applying to the selected memory cell a programming pulse having the determined electrical characteristics comprises applying such a programming pulse for the determined duration.

5. The method of claim 1, wherein determining electrical characteristics for a programming pulse comprises performing a table look up operation using as inputs the objective resistance state and whether the writing of data to the selected memory cell will involve increasing or decreasing resistance of the selected memory cell and obtaining as an output the electrical characteristics.

6. The method of claim 1, further comprising determining whether the current resistance state is within threshold limits of the objective resistance state, wherein applying to the selected memory cell a programming pulse having the determined electrical characteristics comprises applying such a programming pulse to the selected memory cell when the current resistance state is not within the threshold limits of the objective resistance state and not applying a programming pulse to the selected memory cell when the current resistance state is within the threshold limits of the objective resistance state.

7. The method of claim 1, further comprising:
   determining a resulting resistance state of the selected memory cell after application of the programming pulse;
   determining whether the resulting resistance state is within threshold limits of the objective state; and
   reapplying to the selected memory cell a programming pulse having the determined electrical characteristics when the resulting resistance state is not within the threshold limits of the objective state.

8. The method of claim 1, further comprising:
   determining a resulting resistance state of the selected memory cell after application of the programming pulse;
   determining whether the resulting resistance state is within threshold limits of the objective state; and
   determining electrical characteristics for a second programming pulse that will transform the resistance state of the selected memory cell to the objective resistance state based on the determined resulting resistance state and the objective resistance state; and
   applying to the selected memory cell a second programming pulse having the determined electrical characteristics for a second programming pulse.

9. The method of claim 1,
   wherein determining electrical characteristics for a programming pulse that will transform the resistance state of the selected memory cell to the objective resistance state comprises determining a number of programming pulses and corresponding electrical characteristics for each of the number of programming pulse which when applied in series will transform the resistance state of the selected memory cell to the objective resistance state, and
   wherein applying to the selected memory cell a programming pulse having the determined electrical characteristics comprises applying to the selected memory cell the number of programming pulses each having the corresponding electrical characteristics.

10. The method of claim 1, wherein the selected memory cell comprises a variable resistance material selected from the group consisting of an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

11. The method of claim 1, wherein the selected memory cell comprises a resistivity-switching compound selected from the group consisting of NixOy, NbxOy, TixOy, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, $Al_xN_y$.

12. The method of claim 1, wherein the selected memory cell comprises a bipolar metal oxide selected from the group consisting of hafnium oxide ($HfO_x$), nickel oxide (NiO), and titanium oxide ($TiO_x$).

13. A memory device, comprising:
   an array of memory cells positioned between a plurality of word lines and a plurality of bit lines, wherein the memory cells are multilevel cell resistance memory cells; and
   a memory cell program system configured to write data to selected memory cells, wherein the memory controller circuit is configured to perform operations comprising:
      receiving data to be written to the memory device;
      selecting a memory cell to which at least a portion of the received data is to be written;
      obtaining a current resistance state of the selected memory cell;
      determining an objective resistance state for representing data to be written to the selected memory cell;
      determining whether the writing of data to the selected memory cell will involve increasing or decreasing resistance of the selected memory cell based on the current resistance state and the objective resistance state;
      determining electrical characteristics for a programming pulse that will transform the resistance state of the selected memory cell to the objective resistance state based on the objective resistance state and whether the writing of data to the selected memory cell will involve increasing or decreasing resistance of the selected memory cell; and
      applying to the selected memory cell a programming pulse having the determined electrical characteristics;
      wherein the electrical characteristics of the programming pulse are configured to control both a current and a voltage of the memory cell to maintain substantially constant power dissipation in the selected memory cell while applying the programming pulse to the selected memory cell.

14. The memory device of claim 13, wherein the memory cells comprise a variable resistance material selected from the group consisting of an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

15. The memory device of claim 13, wherein the memory cells comprise a resistivity-switching compound selected from the group consisting of NixOy, NbxOy, TixOy, $Hf_xO_y$, $Al_xO_y$, $Mg_xO_y$, $Co_xO_y$, $Cr_xO_y$, $V_xO_y$, $Zn_xO_y$, $Zr_xO_y$, $B_xN_y$, $Al_xN_y$.

16. The memory device of claim 13, wherein the memory cells comprise a bipolar metal oxide resistance storage element and a steering element, wherein bipolar metal oxide resistance storage element comprises a metal oxide selected from the group consisting of hafnium oxide ($HfO_x$), nickel oxide (NiO), and titanium oxide ($TiO_x$).

17. The memory device of claim 13, wherein the multilevel cell resistance memory cells and the memory cell programming system are configured such that the memory cells are programmed with programming pulses to store four bits of data in four different resistance states.

18. The memory device of claim 13, wherein the multilevel cell resistance memory cells and the memory cell programming system are configured such that the memory cells are programmed with programming pulses to store six bits of data in six different resistance states.

19. The memory device of claim 12, wherein the memory cell programming system is configured such that determining electrical characteristics for a programming pulse comprises determining a voltage and a current limit for the programming pulse.

20. The memory device of claim 12, wherein the memory cell programming system is configured such that determining electrical characteristics for a programming pulse comprises determining a voltage and a current limit for the programming pulse when it is determined that the writing of data to the selected memory cell will involve decreasing resistance of the selected memory cell, and determining a voltage for the programming pulse when it is determined that the writing of data to the selected memory cell will involve increasing resistance of the selected memory cell.

21. The memory device of claim 13, wherein the memory cell programming system is configured to perform operations further comprising determining a duration for a programming pulse based on the objective resistance state and whether the writing of data to the selected memory cell will involve increasing or decreasing resistance of the selected memory cell,
   wherein the memory cell programming system is configured such that applying to the selected memory cell a programming pulse having the determined electrical characteristics comprises applying such a programming pulse for the determined duration.

22. The memory device of claim 13, wherein the memory cell programming system is configured such that determining electrical characteristics for a programming pulse comprises accessing a memory coupled to the memory cell programming system to perform a table look up operation using as inputs the objective resistance state and whether the writing of data to the selected memory cell will involve increasing or decreasing resistance of the selected memory cell and obtaining as an output the electrical characteristics.

23. The memory device of claim 13, wherein the memory cell programming system is configured to perform operations further comprising determining whether the current resistance state is within threshold limits of the objective resistance state,
   wherein the memory cell programming system is configured such that applying to the selected memory cell a programming pulse having the determined electrical characteristics comprises applying such a programming pulse to the selected memory cell when the current resistance state is not within the threshold limits of the objective resistance state and not applying a programming pulse to the selected memory cell when the current resistance state is within the threshold limits of the objective resistance state.

24. The memory device of claim 13, wherein the memory cell programming system is configured to perform operations further comprising:
   determining a resulting resistance state of the selected memory cell after application of the programming pulse;
   determining whether the resulting resistance state is within threshold limits of the objective state; and
   reapplying to the selected memory cell a programming pulse having the determined electrical characteristics when the resulting resistance state is not within the threshold limits of the objective state.

25. The memory device of claim 13, wherein the memory cell programming system is configured to perform operations further comprising:
   determining a resulting resistance state of the selected memory cell after application of the programming pulse;
   determining whether the resulting resistance state is within threshold limits of the objective state; and
   determining electrical characteristics for a second programming pulse that will transform the resistance state of the selected memory cell to the objective resistance state based on the determined resulting resistance state and the objective resistance state; and
   applying to the selected memory cell a second programming pulse having the determined electrical characteristics for a second programming pulse.

26. The memory device of claim 13, wherein the memory cell programming system is configured such that:
   determining electrical characteristics for a programming pulse that will transform the resistance state of the selected memory cell to the objective resistance state comprises determining a number of programming pulses and corresponding electrical characteristics for each of the number of programming pulse which when applied in series will transform the resistance state of the selected memory cell to the objective resistance state, and
   applying to the selected memory cell a programming pulse having the determined electrical characteristics comprises applying to the selected memory cell the number of programming pulses each having the corresponding electrical characteristics.

27. The memory device of claim 13, wherein the memory cell programming system comprises:
   a memory controller circuit;
   a bit line controller coupled to the memory controller circuit and configured to select a bit line in response a control signal from the memory controller circuit;
   a word line controller coupled to the memory controller circuit and configured to select a word line in response a control signal from the memory controller circuit;
   a programming pulse generator circuit coupled to the memory controller circuit and configured to generate a programming pulse having a voltage for writing data to selected memory cells in response a control signal from the memory controller circuit;
   a current limiting circuit coupled to the memory controller circuit and configured to limit current flowing through a selected memory cell during a programming pulse in response a control signal from the memory controller circuit; and
   a resistance state determining circuit coupled to the memory controller circuit, the bit line controller and the word line controller and configured to determine a resistance state of a selected memory cell,
   wherein:
      selecting a memory cell to which at least a portion of the received data is to be written comprises activating the bit line and word line controllers to select the memory cell to which the at least a portion of the received data is to be written;
      obtaining a current resistance state of the selected memory cell comprises obtaining the current resistance state of the selected memory cell from the resistance state determining circuit; and
      applying to the selected memory cell a programming pulse having the determined electrical characteristics comprises activating the pulse generation circuit and the current limiting circuit to apply to the selected memory cell a programming pulse having the determined electrical characteristics.

28. A memory device, comprising:
   an array of storage means for storing a plurality of a data bits in the form of a plurality of correlated resistance states;
   means for receiving data to be written to the memory device;
   means for selecting a storage means to which at least a portion of the received data is to be written;
   means for obtaining a current resistance state of the selected storage means;
   means for determining an objective resistance state for representing data to be written to the selected storage means;
   means for determining whether the writing of data to the selected storage means will involve increasing or decreasing resistance of the selected storage means based on the current resistance state and the objective resistance state;
   means for determining electrical characteristics for a programming pulse that will transform the resistance state of the selected storage means to the objective resistance state based on the objective resistance state and whether the writing of data to the selected storage means will involve increasing or decreasing resistance of the selected storage means; and
   means for applying to the selected storage means a programming pulse having the determined electrical characteristics;
   wherein means for determining electrical characteristics for a programming pulse comprises means for determining a voltage and a current limit for the programming pulse when it is determined that the writing of data to the selected storage means will involve decreasing resistance of the selected storage means, and determining a voltage for the programming pulse when it is determined that the writing of data to the selected storage means will involve increasing resistance of the selected storage means;
   wherein the electrical characteristics of the programming pulse are configured to control both a current and a voltage of the memory cell to maintain substantially constant power dissipation in the selected memory cell while applying the programming pulse to the selected memory cell.

29. The memory device of claim 28, wherein the array of storage means comprises multilevel cell resistance memory cells comprising a variable resistance material selected from the group consisting of an antifuse dielectric, fuse, diode and antifuse dielectric arranged in a series, a polysilicon memory effect material, a metal oxide or switchable complex metal oxide material, a carbon nanotube material, a graphene switchable resistivity material, a phase change material, a conductive bridge element, an electrolyte switching material, a switchable polymer material, or carbon resistivity switching material, such as amorphous, polycrystalline or microcrystalline carbon or graphite material.

30. The memory device of claim 28, wherein the array of storage means comprises multilevel cell resistance memory cells comprising a resistivity-switching compound selected from the group consisting of NixOy, NbxOy, TixOy, Hf$_x$O$_y$, Al$_x$O$_y$, Mg$_x$O$_y$, CO$_x$O$_y$, Cr$_x$O$_y$, V$_x$O$_y$, Zn$_x$O$_y$, Zr$_x$O$_y$, B$_x$N$_y$, Al$_x$N$_y$.

31. The memory device of claim 28, wherein the array of storage means comprises multilevel cell resistance memory cells comprising a bipolar metal oxide resistance storage element and a steering element, wherein bipolar metal oxide resistance storage element comprises a metal oxide selected from the group consisting of hafnium oxide (HfO$_x$), nickel oxide (NiO), and titanium oxide (TiO$_x$).

32. The memory device of claim 28, wherein the storage means comprises means for storing four bits of data in four different resistance states.

33. The memory device of claim 28, wherein the storage means comprises means for storing six bits of data in six different resistance states.

34. The memory device of claim 32, wherein means for determining electrical characteristics for a programming pulse comprises means for determining a voltage and a current limit for the programming pulse.

35. The memory device of claim 28, wherein means for determining electrical characteristics for a programming pulse comprises means for determining a voltage and a current limit for the programming pulse when it is determined that the writing of data to the selected storage means will involve decreasing resistance of the selected storage means, and determining a voltage for the programming pulse when it is determined that the writing of data to the selected storage means will involve increasing resistance of the selected storage means.

36. The memory device of claim 28, further comprising means for determining a duration for a programming pulse based on the objective resistance state and whether the writing of data to the selected storage means will involve increasing or decreasing resistance of the selected storage means,
wherein means for applying to the selected storage means a programming pulse having the determined electrical characteristics comprises means for applying such a programming pulse for the determined duration.

37. The memory device of claim 28, further comprising means for storing a data table of electrical characteristics of programming pulses for each objective resistance state,
wherein means for determining electrical characteristics for a programming pulse comprises means for perform a table look up operation using as inputs the objective resistance state and whether the writing of data to the selected storage means will involve increasing or decreasing resistance of the selected storage means and obtaining as an output the electrical characteristics for the programming pulse.

38. The memory device of claim 28, further comprising means for determining whether the current resistance state is within threshold limits of the objective resistance state,
wherein means for applying to the selected storage means a programming pulse having the determined electrical characteristics comprises means for applying such a programming pulse to the selected storage means when the current resistance state is not within the threshold limits of the objective resistance state and not applying a programming pulse to the selected storage means when the current resistance state is within the threshold limits of the objective resistance state.

39. The memory device of claim 28, further comprising:
means for determining a resulting resistance state of the selected storage means after application of the programming pulse;
means for determining whether the resulting resistance state is within threshold limits of the objective state; and
means for reapplying to the selected storage means a programming pulse having the determined electrical characteristics when the resulting resistance state is not within the threshold limits of the objective state.

40. The memory device of claim 28, further comprising:
means for determining a resulting resistance state of the selected storage means after application of the programming pulse;
means for determining whether the resulting resistance state is within threshold limits of the objective state; and
means for determining electrical characteristics for a second programming pulse that will transform the resistance state of the selected storage means to the objective resistance state based on the determined resulting resistance state and the objective resistance state; and
means for applying to the selected storage means a second programming pulse having the determined electrical characteristics for a second programming pulse.

41. The memory device of claim 28, wherein:
means for determining electrical characteristics for a programming pulse that will transform the resistance state of the selected storage means to the objective resistance state comprises means for determining a number of programming pulses and corresponding electrical characteristics for each of the number of programming pulses which when applied in series will transform the resistance state of the selected storage means to the objective resistance state, and
means for applying to the selected storage means a programming pulse having the determined electrical characteristics comprises means for applying to the selected storage means the number of programming pulses each having the corresponding electrical characteristics.

42. A method of writing data to a multilevel cell resistance memory device, comprising:
receiving data to be written to the memory device;
selecting a memory cell to which at least a portion of the received data is to be written;
determining whether writing the data to the selected memory cell will involve increasing resistance (RESET) or decreasing resistance (SET) of the memory cell;
determining an appropriate programming voltage and current limit for the resistance state to be achieved in writing the data to the selected memory cell and applying a pulse having a first determined set electrical characteristics when it is determined that writing the data to the selected memory cell will involve decreasing resistance (SET) of the memory cell; and
determining an appropriate programming voltage for the resistance state to be achieved in writing the data to the selected memory cell and applying a pulse having a second determined set electrical characteristics when it is determined that writing the data to the selected memory cell will involve increasing resistance (RESET) of the memory cell; and
wherein the first set electrical characteristics of the programming pulse are configured to control both a current and a voltage of the memory cell to maintain substantially constant power dissipation in the selected memory cell while decreasing resistance (SET) of the memory cell.

* * * * *